(12) United States Patent
Lewandowski et al.

(10) Patent No.: US 11,895,932 B2
(45) Date of Patent: Feb. 6, 2024

(54) SELECTIVE CHEMICAL FREQUENCY MODIFICATION OF JOSEPHSON JUNCTION RESONATORS

(71) Applicant: International Business Machines Corporation, Armonk, NY (US)

(72) Inventors: Eric Peter Lewandowski, White Plains, NY (US); Jeng-Bang Yau, Yorktown Heights, NY (US); Eric Zhang, Yonkers, NY (US); Bucknell C Webb, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 130 days.

(21) Appl. No.: 16/912,246

(22) Filed: Jun. 25, 2020

(65) Prior Publication Data

US 2021/0408360 A1 Dec. 30, 2021

(51) Int. Cl.
*H10N 60/01* (2023.01)
*H10N 60/12* (2023.01)
*H10N 60/80* (2023.01)

(52) U.S. Cl.
CPC ..... *H10N 60/0912* (2023.02); *H10N 60/0884* (2023.02); *H10N 60/12* (2023.02); *H10N 60/805* (2023.02)

(58) Field of Classification Search
CPC ... H01L 39/2493; H01L 39/223; G06N 10/40; H10N 60/0912; H10N 60/12; H10N 60/805; H10N 69/00; H10N 60/0884
See application file for complete search history.

(56) References Cited

U.S. PATENT DOCUMENTS

| 4,163,156 A | 7/1979 | Daetwyler et al. |
| 4,474,828 A | 10/1984 | Young et al. |
| 4,490,901 A * | 1/1985 | Clark ............ H10N 60/0912 427/63 |
| 9,425,376 B2 | 8/2016 | Greer et al. |
| 10,170,680 B2 | 1/2019 | Abraham et al. |

(Continued)

FOREIGN PATENT DOCUMENTS

| JP | H07263768 A | * 10/1995 |
| JP | H07263768 A | * 10/1995 |

(Continued)

OTHER PUBLICATIONS

Brink, et al. "Device Challenges for near term superconducting quantum processors: frequency collisions" Dec. 1-5, 2018, IEDM San Francisco, CA. 3 pages.

(Continued)

*Primary Examiner* — Aaron J Gray
(74) *Attorney, Agent, or Firm* — Amin, Turocy & Watson, LLP

(57) ABSTRACT

Techniques regarding selectively tuning the operating frequency of superconducting Josephson junction resonators are provided. For example, one or more embodiments described herein can comprise a method that can include chemically altering a Josephson junction of a Josephson junction resonator via a plasma treatment. The method can also comprise selectively tuning an operating frequency of the Josephson junction resonator based on a property of the plasma treatment.

17 Claims, 12 Drawing Sheets

(56) References Cited

U.S. PATENT DOCUMENTS

| | | |
|---|---|---|
| 10,170,681 B1 | 1/2019 | Rosenblatt et al. |
| 10,424,713 B2 | 9/2019 | Rosenblatt et al. |
| 10,475,983 B1 | 11/2019 | Rosenblatt et al. |
| 2019/0165243 A1 | 5/2019 | Orcutt et al. |
| 2019/0165246 A1 | 5/2019 | Rosenblatt et al. |
| 2020/0006421 A1 | 1/2020 | Ladizinsky et al. |
| 2020/0075833 A1 | 3/2020 | Topaloglu et al. |
| 2021/0159382 A1* | 5/2021 | Nah ........................ H10N 60/01 |

FOREIGN PATENT DOCUMENTS

| | | |
|---|---|---|
| WO | 03019685 A2 | 3/2003 |
| WO | WO-2019117883 A1 * | 6/2019 |

OTHER PUBLICATIONS

Kreikebaum, et al. "Improving wafer-scale Josephson junction resistance variation in superconducting quantum coherent circuits." arXiv:1909.09165v1 [quant-ph] Sep. 19, 2019, 10 pages.

International Search Report and Written Opinion for International Application No. PCT/EP2021/066160 dated Nov. 9, 2021, 18 pages.

Suga M et al.: "Oxygen-Plasma-Treated Superconductor-Insulator-Superconductor Junction for Radiation Detector", Japanese Journal of Applied Physics, Part 1. vol. 34, No. 8A, Aug. 1995 (Aug. 1995), pp. 4047-4049, XP055837697, ISSN: 0021-4922, DOI: 10.1143/JJAP.34.4047 sections 2, 3; figure 1.

Response to the communication received for European Patent Application U.S. Appl. No. 21734312.8 dated Aug. 10, 2023, 3 pages.

Examination Report No. 1 received for Australian Patent Application Serial No. 2021295256 dated Oct. 13, 2023, 3 pages.

* cited by examiner

SELECTIVE CHEMICAL FREQUENCY MODIFICATION OF JOSEPHSON JUNCTION RESONATORS

BACKGROUND

The subject disclosure relates to chemically modifying the frequency of selected Josephson junction resonators (e.g., qubits), and more specifically, to tuning an operating frequency of a selected Josephson junction resonators by altering an electrical resistance of a Josephson junction via one or more plasma treatments.

The scaling of quantum computing technology advances complex architectures of multi-qubit processors, wherein maintaining low gate error rates at the limits supported by coherence times is of particular importance. Quantum processors employing fixed-frequency superconducting Josephson-junction-based transmon qubits and/or cross-resonance gates can encounter gate error rates due to at least frequency collisions and/or frequency crowding. For instance, neighboring qubits can be degenerate in one or more conditions that degrade gate fidelities.

In order to mitigate frequency collisions and/or frequency crowding, the fixed frequencies of superconducting qubits can be engineered by altering Josephson junction resistance and/or transmon capacitance. For example, Josephson junctions can be laser annealed to increase electrical resistance and lower qubit frequency. However, laser annealing offers a very narrow tuning range (e.g., 15-20 percent) with respect to the initial Josephson junction resistance. Yet, the fabrication of multi-qubit arrays can yield large distributions of Josephson junction resistances per chip. The limited tuning range offered by laser annealing can prove insufficient in tuning qubits across the large resistance distribution, and can also inhibit setting the mean Josephson junction resistance of the chip to a target frequency range (e.g., a few hundred megahertz for tansmons with frequencies on the order of 5 gigahertz).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, methods, systems, and/or apparatuses regarding tuning the operating frequency of Josephson junction resonators (e.g., superconducting qubits) via one or more plasma treatments are described.

According to an embodiment, a method is provided. The method can comprise chemically altering a Josephson junction of a Josephson junction resonator via a plasma treatment. The method can also comprise selectively tuning an operating frequency of the Josephson junction resonator based on a property of the plasma treatment. An advantage of such a method can be the ability to modify the operating frequency across a wide range, with respect to the initial operating frequency.

In some examples, the property can be at least one member selected from the group consisting of a processing time of the plasma treatment, a chemical composition of the plasma treatment, an amount of energy delivered to the Josephson junction by the plasma treatment, and a partial pressure of a gas employed by the plasma treatment. An advantage of such a method can be an acute amount of control over the amount of chemical modification achieved by the plasma treatment.

According to another embodiment, a method is provided. The method can comprise chemically altering a Josephson junction of a Josephson junction resonator via a plasma treatment. The method can also comprise adjusting an electrical resistance of the Josephson junction based on a property of the plasma treatment. An advantage of such a method can be the modification of a qubit chip to achieve a target mean electrical resistance.

In some examples, the method can further comprise localizing the plasma treatment to a proximity of the Josephson junction via a plasma beam. An advantage of such a method can be rapid transitioning between plasma treatments and electrical resistance measuring such that repeated employment of the plasma treatment can be assessed and executed in an expediate manner.

According to another embodiment, a method is provided. The method can comprise exposing a Josephson junction of a Josephson junction resonator to a plasma treatment. The plasma treatment can tune an operating frequency of the Josephson junction resonator to a target operating frequency by altering an electrical resistance of the Josephson junction. An advantage of such a method can be the tuning of fixed frequency superconducting qubits to mitigate occurrences of frequency collisions and/or frequency crowding.

In some examples, the method can further comprise shielding a second Josephson junction from the plasma treatment, wherein the second Josephson junction neighbors the Josephson junction of the Josephson junction resonator. An advantage of such a method can be the selective tuning of target Josephson junctions.

According to another embodiment, an apparatus is provided. The apparatus can comprise an actuator operably coupled to a cover sheet that comprises a hole positioned over a platform configured to structurally support a Josephson junction resonator die. An advantage of such an apparatus can be the ability to precisely control the amount of time Josephson junctions are exposed to a plasma treatment.

In some examples, the apparatus can further comprise a guide housing positioned adjacent to the cover sheet and configured to guide a motion of the cover sheet that is initiated by the actuator. An advantage of such an apparatus can be that the apparatus can guide serial alteration to target Josephson junctions on the qubit die.

According to another embodiment, a system is provided. The system can comprise an actuator operably coupled to a cover sheet that comprises a hole. The system can also comprise a computer readable storage medium having program instructions embodied therewith. The program instructions can be executable by a processor to cause the processor to control, by the processor, operation of the actuator such that the actuator adjusts a position of the hole with respect to a Josephson junction located on a Josephson junction resonator die shielded by the cover sheet. An advantage of such a system can be the controlled implementation of one or more plasma treatments so as to selectively tune respective Josephson junction resonators of a qubit array.

In some examples, the program instructions can further cause the processor to control, by the processor, operation of the actuator such that the actuator aligns the hole of the cover sheet with the Josephson junction. An advantage of such a system can be multiple Josephson junction resonators can be tuned in parallel or in series based on the alignment of the cover sheet.

DETAILED DESCRIPTION

Figure 1:
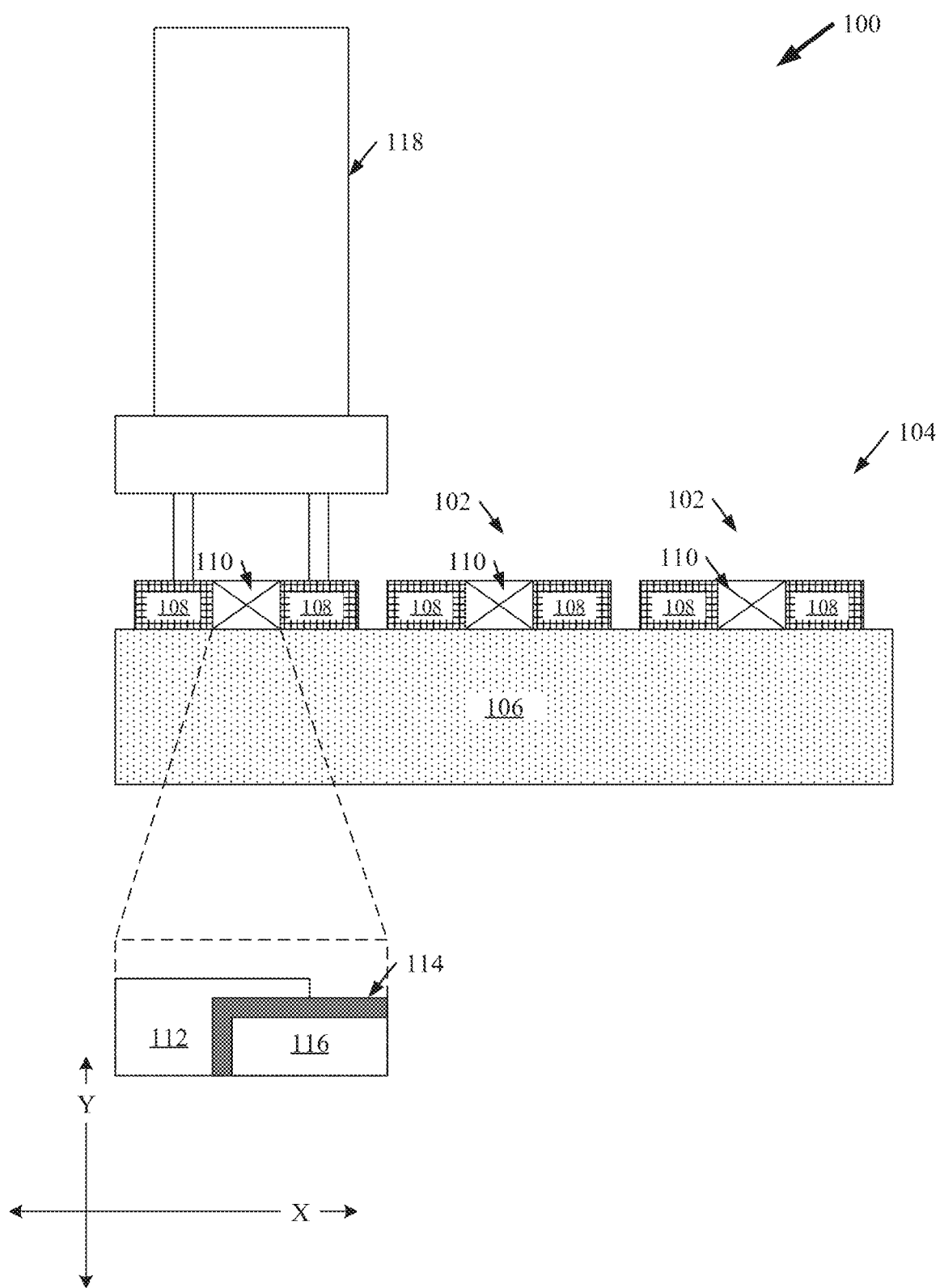
FIG. 1 illustrates a diagram of an example, non-limiting first stage of a Josephson junction resonator frequency tuning process, wherein one or more Josephson junction resonators (e.g., superconducting qubits) can be identified for exposure to one or more subsequent plasma treatments in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Various embodiments described herein can regard methods, apparatuses, and/or systems that can chemically modify the electrical resistance of one or more Josephson junctions to alter the operating frequency of selected Josephson junction resonators (e.g., superconducting qubits). In one or more embodiments, one or more Josephson junction resonators can be subjected to one or more plasma treatments to alter the Josephson junction electrical resistance. In various embodiments the one or more Josephson junction resonator can comprise Josephson junctions that can transition (e.g., the electrical resistance can be altered) from a first electrical resistance to a second electrical resistance when a plasma source is applied to the one or more Josephson junctions. For example, the electrical resistance of the one or more Josephson junctions can be increased or decreased from an initial resistance value to a target resistance value based on one or more properties of the plasma treatment. Example properties that can influence the electrical resistance transition can include, but are not limited to: a processing time of the plasma treatment, a chemical composition of the plasma treatment, an amount of energy delivered to the Josephson junction by the plasma treatment, partial pressures of the plasma gases, a combination thereof, and/or the like.

As the electrical resistance of the one or more Josephson junctions transitions, the operating frequency of the one or more Josephson junctions can thereby be altered. For example, an increase in the electrical resistance of the one or more Josephson junctions can be correlated to a decrease in the operating frequency of the one or more Josephson junction resonators. For instance, the one or more plasma treatments can increase the electrical resistance of the one or more Josephson junctions, and thereby lower the operating frequency of the one or more Josephson junction resonators. In another example, a decrease in the electrical resistance of the one or more Josephson junctions can be correlated to an increase in the operating frequency of the one or more Josephson junction resonators.

In various embodiments, the one or more plasma treatments can be directed to target Josephson junction resonators using one or more patterned masks. For instance, the one or more patterned masks can shield one or more Josephson junction resonators from the plasma treatment while exposing the one or more target Josephson junction resonators. In another example, the one or more plasma treatments can be implemented via one or more localized techniques, such as one or more direct-write processes.

In one or more embodiments, one or more apparatuses and/or systems can further facilitate frequency tuning methods by controlling one or more sliding shields. For example, the movement of one or more sliding shields can be guided with respect to Josephson junctions positioning on a Josephson junction resonator die (e.g., a qubit die). The sliding shields can include one or more holes for directing the application of the one or more plasma treatments, wherein the one or more holes can be aligned with target Josephson junction resonators by moving the one or more sliding shields.

FIG. 1 illustrates a diagram of an example, non-limiting first stage of a Josephson junction resonator frequency tuning process 100 in accordance with one or more embodiments described herein. Repetitive description of like elements employed in other embodiments described herein is omitted for sake of brevity. During the first stage of a Josephson junction resonator frequency tuning process 100, one or more target Josephson junction resonators 102 can be identified for operating frequency alteration.

As shown in FIG. 1, a plurality of Josephson junction resonators 102 can be comprised within a Josephson junction resonator die 104. For example, a plurality of Josephson junction resonators 102 can be positioned on a semiconductor substrate 106. One of ordinary skill in the art will recognize that the arrangement of the Josephson junction resonators 102 on the semiconductor substrate 106 can vary depending on the function and/or type of qubit processor being fabricated.

The semiconductor substrate 106 can be crystalline, semi-crystalline, microcrystalline, or amorphous. The semiconductor substrate 106 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The semiconductor substrate 106 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the semiconductor substrate 106 can also have other layers, such as oxides with high dielectric constants ("high-K oxides") and/or nitrides. In one or more embodiments, the semiconductor substrate 106 can be a silicon wafer. In various embodiments, the semiconductor substrate 106 can comprise a single crystal silicon (Si), silicon germanium (e.g., characterized by the chemical formula SiGe), a Group III-V semiconductor wafer or surface/active layer, a combination thereof, and/or the like.

In various embodiments, the plurality of Josephson junction resonators 102 can be qubits (e.g., fixed-frequency superconducting transmons) and/or traveling wave or parametric amplifiers that utilize Josephson junction technology. For example, the one or more Josephson junction resonators 102 can comprise one or more capacitors 108 and/or Josephson junctions 110. Additionally, the one or more Josephson junction resonators 102 can be interconnected to each other and/or operably coupled to one or more read-out devices and/or circuitries. In one or more embodiments, the one or more Josephson junction resonators 102 can be fabricated with or without flux lines. While FIG. 1 depicts a Josephson junction resonator die 104 (e.g., a qubit die) comprising three example Josephson junction resonators 102, one of ordinary skill the art will recognize that embodiments comprising fewer than three Josephson junction resonators 102 or greater than three Josephson junction resonators 102 are also envisaged. For example the Josephson junction resonator die 104 can comprise an array of Josephson junction resonators 102 positioned in various arrangements on the semiconductor substrate 106. Further, the composition and/or structure of the Josephson junction resonators 102 can vary or be substantially the same.

FIG. 1 depicts an exploded view of a Josephson junction 110 of one of the example Josephson junction resonators 102. As shown in FIG. 1, the one or more Josephson junctions 110 can comprise a tri-layer structure comprising: a first superconducting metal layer 112, a metal oxide or nitride layer 114, and a second superconducting metal layer 116. As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

In various embodiments, the first superconducting metal layer 112 and the second superconducting metal layer 116 can have the same, or substantially the same, metal composition. Additionally, the metal oxide or nitride layer 114 can comprise the metal composition of the first superconducting metal layer 112 and the second superconducting metal layer 116 oxidized or nitrided. Example metals that can comprise the first superconducting metal layer 112 and the second superconducting metal layer 116 can include, but are not limited to: aluminum (Al), niobium (Nb), niobium nitride (NbN), a combination thereof, and/or the like. For example, the first superconducting metal layer 112 and the second superconducting metal layer 116 can comprise Al and the metal oxide or nitride layer 114 can comprise aluminum oxide (AlOx), magnesium oxide (MgO), and/or aluminum nitride (AlN); for example, rendering a Josephson junction 110 having an Al/AlOx/Al tri-layer structure. Also shown in FIG. 1, the one or more Josephson junctions 110 can be positioned between, and/or operably coupled to, one or more superconducting capacitors 108 (e.g., comprising a superconducting metal, such as Nb, Nb, NbCN. NbTiN, Pb. NbN, TiN, Ta, and/or the like) in parallel or in series.

In various embodiments, the one or more Josephson junctions 110 can have an effective critical current ranging from, for example, greater than or equal to 10 and less than or equal to 100 nanoamperes. The critical current can be related to the electrical resistance of the one or more Josephson junctions 110 as described by the Ambegaokar-Baratoff relation prior to achieving a superconducting state. For example, prior to achieving the superconducting state, the electrical resistance of the one or more Josephson junctions 110 can be inversely proportional to the critical current after turning superconducting. Likewise, the critical current can be inversely proportional to the inductance of the one or more Josephson junctions 110. Thereby, the resonance frequencies of the one or more Josephson junction resonators 102 can range, for example, from greater than or equal to a few hundred megahertz and less than or equal to 20 gigahertz.

In one or more embodiments, the one or more Josephson junction resonators 102 can be single-junction transmon qubits; thereby not being susceptible to tuning using a magnetic field and having a resonance frequency fixed by the parameters of the capacitor 108 and Josephson junction 110 formed during fabrication. Additionally, in various embodiments the one or more Josephson junction resonators 102 can be phase and/or charge qubits. For instance, the one or more Josephson junction resonators 102 can comprise two or more Josephson junctions 110 arranged in series or in parallel circuit elements. Further, the one or more Josephson junctions 110 can be formed in accordance with a variety of fabrication methods, including, for example: subtractive patterning the tri-layer structure, or the Dolan bridge process.

As described herein, the one or more Josephson junction 110 can be subject to one or more plasma treatments to alter the electrical resistance of the Josephson junction 110 and thereby the operating frequency of the respective Josephson junction resonator 102. Further, the one or more plasma treatments can be applied to target Josephson junctions 110 to selectively modify target Josephson junction resonators 102. As shown in FIG. 1, the initial electrical resistance of the one or more Josephson junctions 110 can be measured in order to identify Josephson junction resonators 102 for modification. For example, an electrical resistance probe can be employed to measure the electrical resistance of specific Josephson junctions 110 and/or Josephson junction resonators 102. For instance, FIG. 1 depicts the use of an exemplary 4-prong electrical resistance probe 118 to measure the electrical resistance. In various embodiments, Junction resistance measurements can be a valuable proxy for the junction resonator frequency. Additionally, the Josephson junction resonator die 104 can be cooled through the superconducting transition and the resonant frequency can be measured directly by measuring the frequency-dependent device impedance with a network analyzer.

In various embodiments, the measured electrical resistance and/or resonant frequency can be compared to one or more defined thresholds to determine whether a Josephson junction resonator 102 should be targeted for subsequent plasma treatments. For instance, one or more Josephson junctions 110 and/or Josephson junction resonators 102 can be identified as target Josephson junctions 110 and/or target Josephson junction resonators 102 based on whether the measured electrical resistance is greater than a defined resistance threshold or less than a defined resistance threshold. In one or more embodiments, the measured electrical resistance of a first Josephson junction 110 and/or Josephson junction resonator 102 can be compared against the measured electrical resistance of a second Josephson junction 110 and/or Josephson junction resonator 102. For example, the electrical resistance of neighboring Josephson junctions 110 can be measured and compared with each other to identify one or more Josephson junctions 110 and/or Josephson junction resonators 102 for targeting by one or more plasma treatments.

Figure 2:
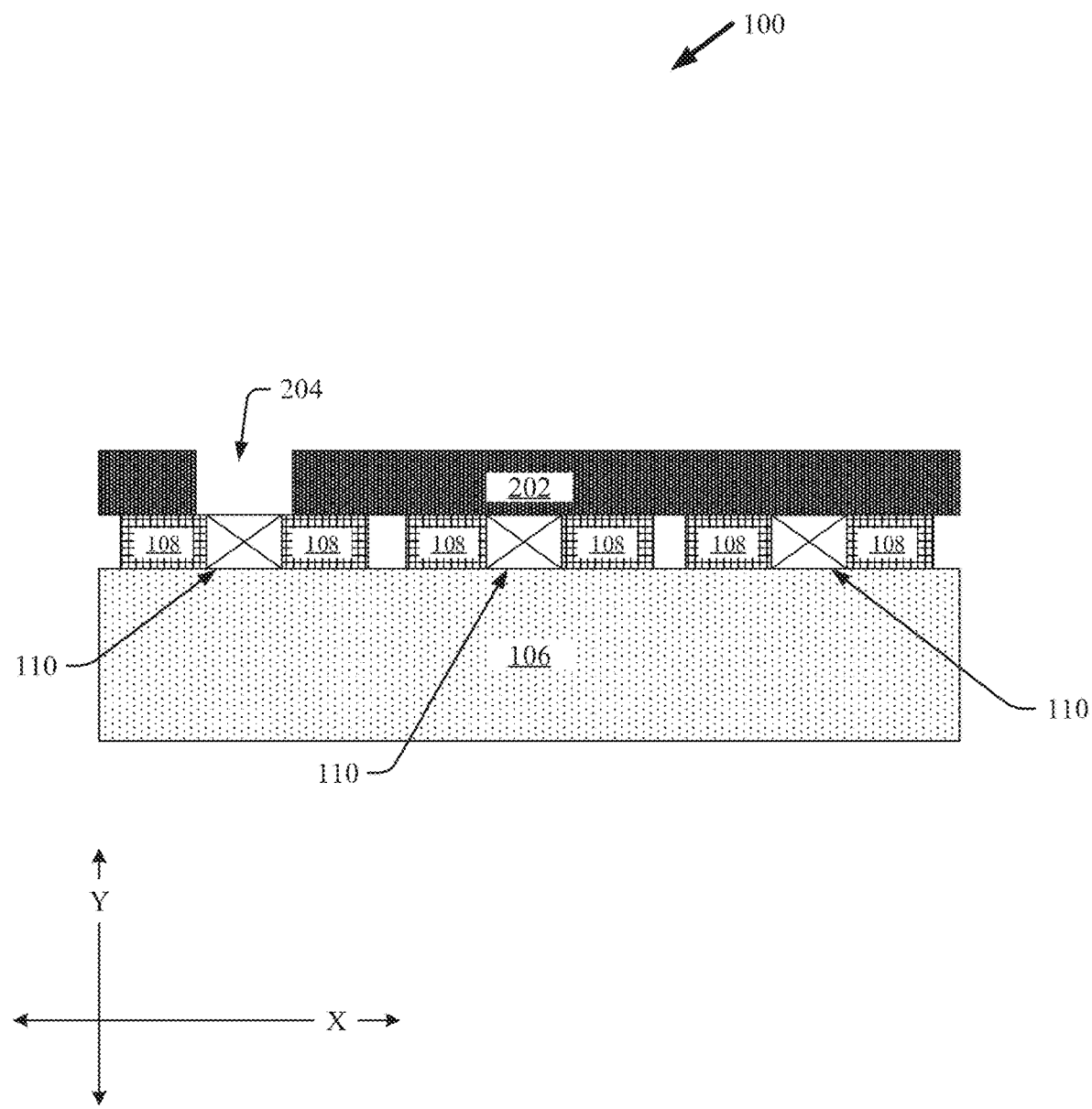
FIG. 2 illustrates a diagram of an example, non-limiting second stage of the Josephson junction resonator frequency tuning process, wherein one or more masks can be patterned to protect one or more Josephson junction resonators while exposing the one or more identified Josephson junction resonators in accordance with one or more embodiments described herein.

FIG. 2 illustrates a diagram of the example, non-limiting second stage of the Josephson junction resonator frequency tuning process 100 in accordance with one or more embodiments described herein. Repetitive description of like elements employed in other embodiments described herein is omitted for sake of brevity. During the second stage of the Josephson junction resonator frequency tuning process 100, one or more masks 202 can be deposited and/or patterned onto the plurality of Josephson junction resonators 102.

In various embodiments, the one or more masks 202 can be deposited and/or patterned onto the plurality of Josephson junction resonators 102 based on the measured electrical resistance of the Josephson junctions 110. For example, the one or more masks 202 can cover one or more Josephson junctions 110 of Josephson junction resonators 102 not targeted for modification by one or more subsequent plasma treatments, while leaving exposed one or more other Josephson junctions 110 of Josephson junction resonators 102 targeted for modification. The one or more masks 202 can shield one or more underlying Josephson junction resonators 102 and/or Josephson junctions 110 from plasma treatments. For example, the one or more masks 202 can inhibit one or more reactant species of the one or more plasma treatments from interacting with the covered Josephson junction resonators 102 and/or Josephson junctions 110. Example materials that can be comprised within the one or more masks 202 can include, but are not limited to: stainless steel, Al, steel, cupper (Cu), molybdenum (Mo), titanium (Ti), tantalum (Ta), glass, silicon (Si), silicon carbide (SiC), quartz, other metals, a combination thereof, and/or the like.

As shown in FIG. 2, one or more mask holes 204 can be patterned into the one or more masks 202. The one or more mask holes 204 can be aligned with one or more Josephson junctions 110 targeted for modification based on the measured electrical resistance. Thereby, the one or more targeted Josephson junctions 110 can remain exposed (e.g., uncovered) despite the presence of the one or more masks 202. In various embodiments, the one or more mask holes 204 can have a polygonal shape (e.g., triangular, rectangular, square, etc.) or a circular shape. Additionally, the size of the one or more mask holes 204 can vary based on the size of the one or more target Josephson junctions. Moreover, the size of the one or more mask holes 204 can account for one or more hole fabrication tolerances (e.g., dicing tolerances, laser cutting tolerances) and/or alignment tolerances. For example, the one or more mask holes 204 can be square holes in the one or more masks 202, and can have dimensions ranging, for instance, from 50 micrometers (μm) by 50 μm to 500 μm by 500 μm.

In one or more embodiments, the one or more masks 202 can be a rigid material (e.g., being flat or substantially flat) that can be patterned with the one or more mask holes 204 prior to being placed onto the plurality of Josephson junction resonators 102. For example, the one or more mask holes 204 can be cut into the rigid material at positions based on the arrangement of Josephson junction resonators 102 on the semiconductor substrate 106. Example cutting processes can include, but are not limited to, dicing and/or laser cutting. For instance, the location of the Josephson junctions 110 included in the Josephson junction resonator die 104 can be mapped onto the one or more masks 202. The positions of targeted Josephson junctions 110 can be identified on the mapped mask 202, wherein material of the mask 202 can be removed from the identified positions to form the mask holes 204. Thereby, when the one or more masks 202 are placed onto the Josephson junction resonator die 104, the one or more mask holes 204 can be aligned with the one or more Josephson junctions 110 targeted for exposure to a plasma treatment based on the measured electrical resistance.

In some embodiments, the one or more masks 202 can be deposited onto the one or more Josephson junction resonators 102 via one or more deposition processes. As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

Further, the one or more mask holes 204 can be formed by not depositing the one or more masks 202 at the mask hole 204 locations during the one or more deposition processes. Alternatively, the one or more mask holes 204 can be formed by removing one or more portions of the one or more deposited masks 202 via one or more etching and/or removal processes. As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

The one or more masks 202 can have a thickness (e.g., along the y-axis) of, for example, greater than or equal to 10 micrometers (μm) and less than or equal to 5 millimeters (mm). As shown in FIG. 2, the one or more mask holes 204 can extend through the entirety of, or substantially the entirety of, the thickness of the one or more masks 202. Further, in various embodiments the one or more mask holes 204 can be directly aligned with the target Josephson junction 110 position or offset with regards to the target Josephson junction 110 position. For example, FIG. 2 illustrates an example embodiment in which the mask hole 204 is directly aligned with the target Josephson junction 110 (e.g., far left Josephson junction 110). However, embodiments in which the mask hole 204 is only partially aligned with the target Josephson junction 110 (e.g., thereby rendering at least a portion of the target Josephson junction 110 covered by the one or more masks 202) are also envisaged.

In various embodiments, the dimensions of the one or more mask holes 204 can depend on the dimensions of the one or more target Josephson junctions 110 and/or the measured electrical resistance of the one or more target Josephson junctions 110. In one or more embodiments, the dimensions of the one or more mask holes 204 can be in accordance with one or more defined standards. Further, wherein the one or more masks 202 comprise a plurality of mask holes 204, the mask holes 204 can have the same dimensions or varied dimensions. For example, a first mask hole 204 can be characterized by a first set of dimensions, while a second mask hole 204 can be characterized by a second set of dimensions; wherein the first and second set of dimensions can be substantially equivalent or different.

The dimensions of the one or more mask holes 204 can directly influence the degree of chemical alteration achieved by the one or more subsequent plasma treatments. Thus, the dimensions of the mask holes 204 can be defined based on the amount of resistance transitioning planned for the target Josephson junction 110 aligned, or partially aligned, with the respective mask holes 204. For instance, in one or more embodiments a first mask hole 204 corresponding to a first Josephson junction 110 can be larger than a second mask hole 204 corresponding to a second Josephson junction 110, wherein the first Josephson junction 110 can be targeted for a larger amount of electrical resistance transitioning than the second Josephson junction 110. Additionally, the degree of chemical alteration can be further influenced by other characteristics of the plasma treatments (e.g., types of reactant species employed in the plasma treatments, amount of energy imparted by the plasma treatments, amount of time the target Josephson junctions 110 are exposed to the plasma treatments, a combination thereof, and/or the like) in accordance with various embodiments described herein. In one or more embodiments, the mask holes 204 can have uniform dimensions, wherein the desired degree of chemical alteration can be achieved via manipulation of one or more of the other plasma treatment characteristics.

Figure 3:
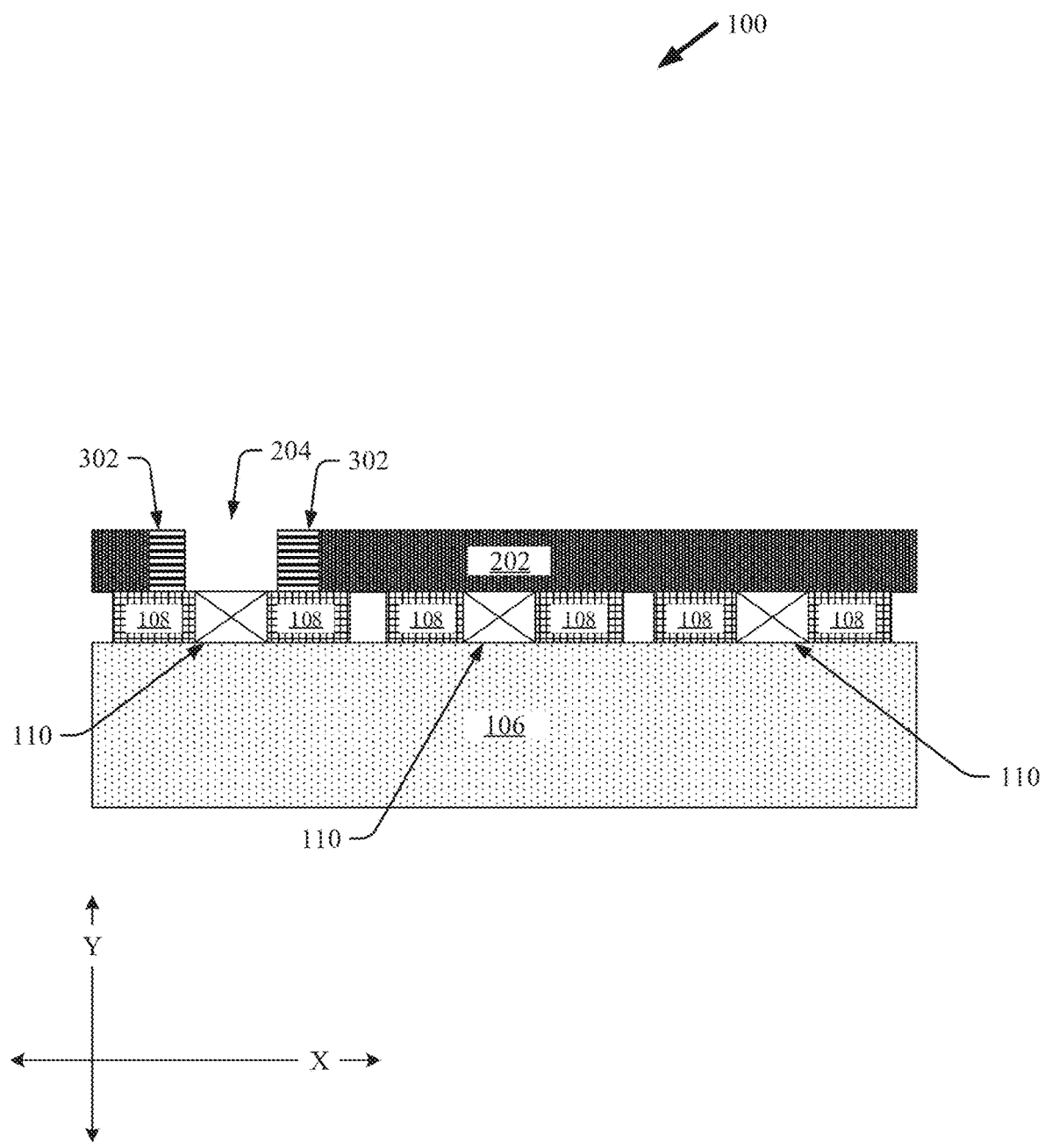
FIG. 3 illustrates a diagram of example, non-limiting Josephson junction resonator die that is at least partially covered by one or more masks comprising one or more electrodes that can control migration of one or more reactant gas species of a plasma treatment in accordance with one or more embodiments described herein.

FIG. 3 illustrates a diagram of the example, non-limiting second stage of the Josephson junction resonator frequency tuning process 100 including an embodiment of the one or more masks 202 having one or more electrodes 302 in accordance with one or more embodiments described herein. Repetitive description of like elements employed in other embodiments described herein is omitted for sake of brevity. As shown in FIG. 3, in various embodiments the one or more masks 202 can further include one or more electrodes 302 positioned at the perimeter of the one or more mask holes 204.

As shown in FIG. 3, one or more electrodes 302 can be incorporated into the one or more masks 202 surrounding, or at least partially surrounding, the one or more mask holes 204. Additionally, embodiments comprising the one or more electrodes 302 positioned on top of the one or more masks 202 and surrounding, or at least partially surrounding, the one or more mask holes 204 are also envisaged. The one or more electrodes 302 can have a thickness (e.g., along the y-axis) that is less than, the same, or greater than the thickness of the one or more masks 202. Example types of electrodes 302 that can be positioned adjacent to the one or more mask holes 204 can include, but are not limited to: charged plates, magnetic coils, a combination thereof, and/or the like. In various embodiments, the one or more electrodes 302 can be deposited via one or more deposition processes subsequent to the formation of the one or more mask holes 204.

In various embodiments, the one or more electrodes 302 can generate one or more electrical and/or magnetic fields that can modulate migration of plasma species through the one or more mask holes 204. An electrical current can be supplied to the one or more electrodes 302 to generate an electrical and/or magnetic field that can repel the reactant species of one or more plasma treatments. Thereby, activating the one or more electrodes 302 can generate the one or more electrical and/or magnetic fields and can protect a corresponding target Josephson junction 110 from plasma treatment despite the target Josephson junction 110 being exposed by a mask hole 204.

In one or more embodiments, respective electrodes 302 can be positioned adjacent to respective mask holes 204 such that migration of the plasma reactant species through the mask holes 204 can be selectively controlled. For example, a first electrode 302 positioned adjacent to a first mask hole 204 can be activated at a different time during the plasma treatment than a second electrode 302 positioned adjacent to a second mask hole 204. Thereby, a first Josephson junction 110 aligned with the first mask hole 204 can have a different exposure time to the plasma treatment than a second Josephson junction 110 aligned with the second mask hole 204. Thus, an amount of chemical alteration achieved by the plasma treatment can vary between the first and second Josephson junctions 110 based on the activation or deactivation of the first and second electrodes 302.

Figure 4:
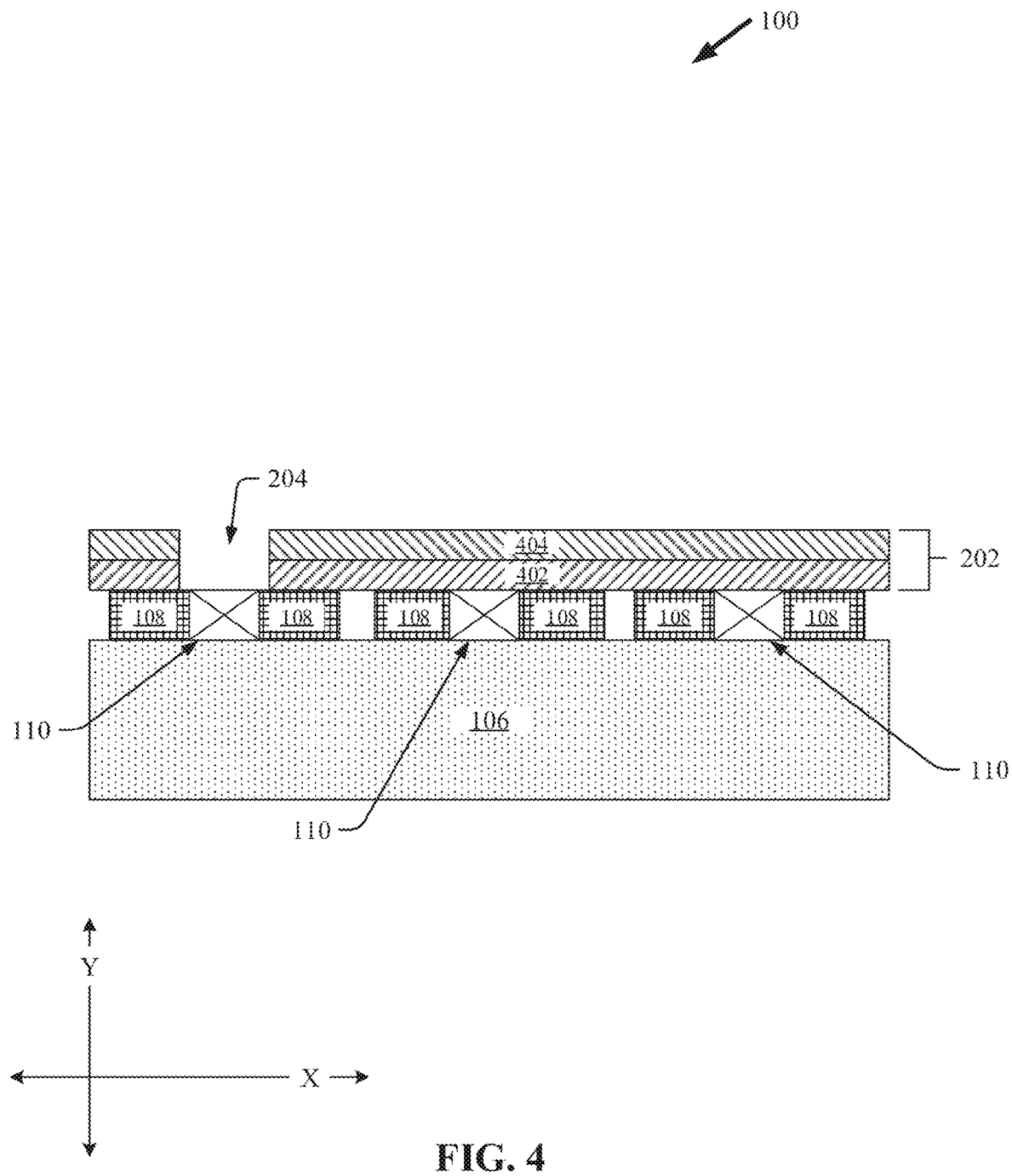
FIG. 4 illustrates a diagram of example, non-limiting Josephson junction resonator die that is at least partially covered by one or more multi-layer masks in accordance with one or more embodiments described herein.

FIG. 4 illustrates a diagram of the example, non-limiting second stage of the Josephson junction resonator frequency tuning process 100 including an embodiment of the one or more masks 202 having multiple layers in accordance with one or more embodiments described herein. Repetitive description of like elements employed in other embodiments described herein is omitted for sake of brevity. As shown in FIG. 4, in various embodiments the one or more masks 202 can further comprise one or more layers that can impart various functionalities to the one or more masks 202. For example, the one or more masks 202 can comprise a first layer 402 and/or a second layer 404. Embodiments are envisaged in which the one or more masks 202 comprise the first layer 402, the second layer 404, or both the first layer 402 and the second layer 404 (e.g., as shown in FIG. 4).

In one or more embodiments, the first layer 402 can comprise one or more inert materials that do not contaminate the one or more Josephson junction resonators 102. For example, the first layer 402 can be positioned on one or more sides of the mask 202 facing the one or more Josephson junction resonators 102. Further, the first layer 402 can be in contact with the one or more Josephson junction resonators 102 upon deposition and/or placement of the one or more masks 202. Additionally, the first layer 402 can comprise one or more soft and/or elastic materials so as to avoid physical damage when contacting the one or more Josephson junction resonators 102. Moreover, the first layer 402 can comprise one or more materials that can absorb one or more plasma species of the one or more plasma treatments (e.g., thereby further protecting and/or isolating Josephson junction resonators 102 neighboring one or more target Josephson junctions 110). Example materials that can be comprised within the first layer 402 can include, but are not limited to: polymers (e.g., polyimide, Teflon), epoxies, silicones, metals (e.g., stainless steel, Mo, and/or the like), Ti, Ta, dielectrics (e.g., TiN, SiC, $Al_2O_3$) a combination thereof, and/or the like. In various embodiments, the first layer 402 can have a thickness (e.g., along the y-axis) that is, for example, greater than or equal to 100 nanometers (nm) and less than or equal to 1 mm. In one or more embodiments, the first layer 402 can be positioned across the entire, or substantially entire, width (e.g., along the x-axis) of the mask 202 or across a portion of the mask's 202 width. For example, the first layer 402 can be selectively positioned on the portions of the mask 202 aligned with covered Josephson junction resonators 102.

In one or more embodiments, the second layer 404 can comprise one or more materials that can be inert to the one or more plasma treatments. For example, the second layer 404 can comprise one or more materials that remain unreactive during the one or more plasma treatments. The second layer 404 can be positioned on one or more sides of the mask 202 facing away from the one or more Josephson junction resonators 102. For example, the second layer 404 can be positioned on one or more sides of the mask 202 facing the one or more plasma treatments. For instance, the one or more masks 202 can comprise both the first layer 402 and the second layer 404, wherein the respective layers can be positioned at opposite surfaces and/or sides of the one or more masks 202. Example materials that can be comprised within the second layer 404 can include, but are not limited to: stainless steel, Al, steel, Cu, Mo, Ti, Ta, glass, quartz, Si, SiC, other metals, a combination thereof, and/or the like. In various embodiments, the second layer 404 can have a thickness (e.g., along the y-axis) that is, for example, greater than or equal to 25 μm and less than or equal to 10 mm. In one or more embodiments, the second layer 404 can be positioned across the entire, or substantially entire, width (e.g., along the x-axis) of the mask 202 or across a portion of the mask's 202 width.

Figure 5:
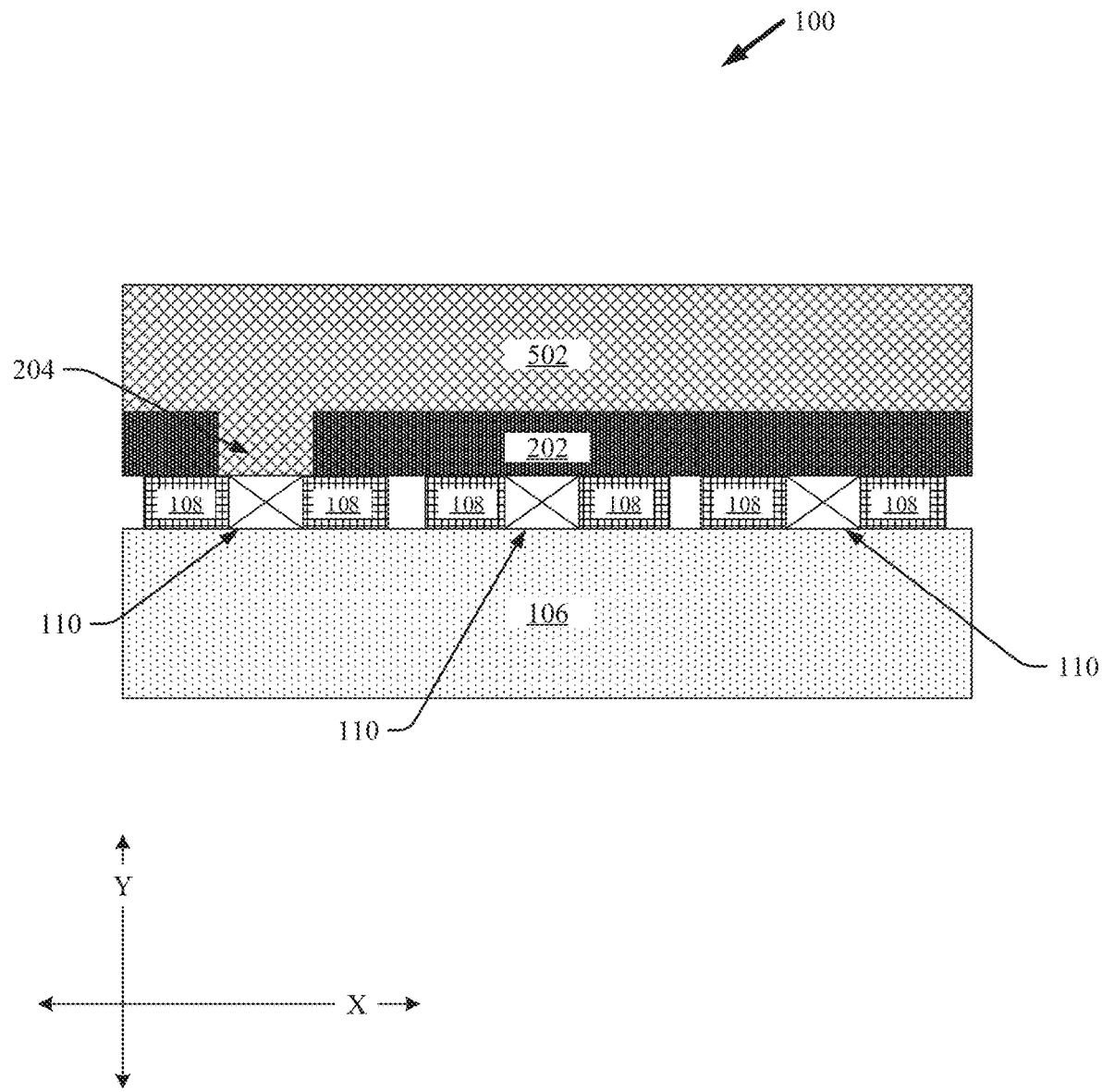
FIG. 5 illustrates a diagram of an example, non-limiting third stage of the Josephson junction resonator frequency tuning process, wherein the one or more exposed Josephson junction resonators can be subjected to one or more plasma treatments in accordance with one or more embodiments described herein.

FIG. 5 illustrates a diagram of the example, non-limiting third stage of the Josephson junction resonator frequency tuning process 100 in accordance with one or more embodiments described herein. Repetitive description of like elements employed in other embodiments described herein is omitted for sake of brevity. During the third stage of the Josephson junction resonator frequency tuning process 100, one or more plasma treatments can be implemented.

In one or more embodiments, the one or more plasma treatments can discharge reactant plasma 502 onto the one or more masks 202. Further, the reactant plasma 502 can flow through the one or more mask holes 204 and interact with the one or more target Josephson junctions 110. As shown in FIG. 5, Josephson junctions 110 covered by the one or more masks 202 can be protected from the reactant plasma 502, while one or more target Josephson junctions 110 not covered by the one or more masks 202 can be exposed to the reactant plasma 502 via the one or more mask holes 204. In various embodiments, all, or substantially all, the target Josephson junctions 110 can be chemically altered by the reactant plasma 502 in parallel (e.g., simultaneously). For instance, by discharging the reactant plasma 502 onto the entirety, or substantially the entirety, of the one or more masks 202; the reactant plasma 502 can access the mask holes 204 in parallel and thereby chemically alter the electrical resistance of the target Josephson junctions 110 in parallel.

Example forming gases that can employed during the one or more plasma treatments, and thereby be comprised within the reactant plasma 502, can include, but are not limited to: hydrogen, oxygen, nitrogen, helium (He), methane, ethane, propane, butane, ammonia, hydrogen peroxide, a combination thereof, and/or the like. In one or more embodiments, the one or more plasma treatments can be performed in vacuum pressure or atmospheric pressure. In one or more embodiments, the one or more plasma treatments can be exposed to the one or more target Josephson junctions 110 for a time ranging from, for example, greater than or equal to 1 second and less than or equal to 300 seconds. In one or more embodiments, at least one of the one or more plasma treatments is a hydrogen plasma treatment, wherein the reactant plasma 502 is hydrogen plasma.

As described herein, the one or more plasma treatments can chemically alter the electrical resistance of the exposed, target Josephson junctions 110. The amount of electrical resistance transitioning experienced by the one or more target Josephson junctions 110 can depend on, for example: a processing time of the one or more plasma treatments (e.g., how long the target Josephson junctions 110 are exposed to the one or more plasma treatments), a chemical composition of the one or more plasma treatments, an amount of energy delivered to the one or more target Josephson junctions 110 by the one or more plasma treatment, partial pressures of the plasma gases, a combination thereof, and/or the like. In one or more embodiments, characteristics of the one or more plasma treatments (e.g., reactant composition, plasma frequency, exposure time, and/or the like) can be modulated to influence the amount of electrical resistance transitioning achieved.

In various embodiments, the third stage can include a series of plasma treatments, wherein each plasma treatment of the series can employ a different species of reactant plasma 502. For example, during a first plasma treatment, the reactant plasma 502 can comprise hydrogen plasma;

wherein a second plasma treatment can be subsequently employed that discharges oxygen plasma as the reactant plasma 502. Additionally, each plasma treatment of the series of plasma treatments can have the one or more of the same characteristics and/or one or more different characteristics (e.g., different reactant composition, plasma frequency, exposure time, and/or the like).

Figure 6:
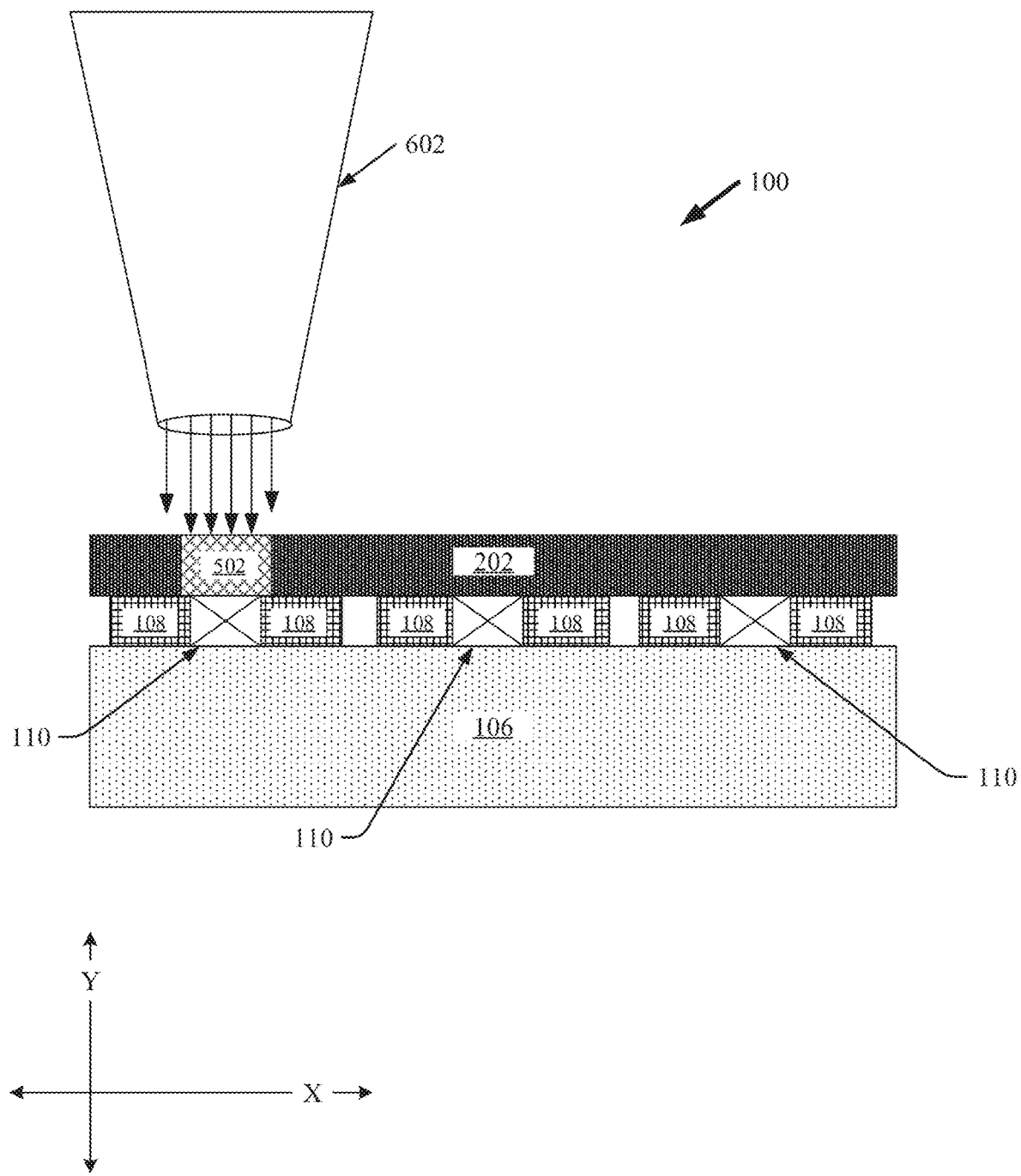
FIG. 6 illustrates a diagram of the example, non-limiting third stage of the Josephson junction resonator frequency tuning process, wherein the one or more plasma treatments can be localized in accordance with one or more embodiments described herein.

FIG. 6 illustrates a diagram of the example, non-limiting third stage of the Josephson junction resonator frequency tuning process 100, wherein the one or more plasma treatments are localized in accordance with one or more embodiments described herein. Repetitive description of like elements employed in other embodiments described herein is omitted for sake of brevity. During the third stage of a Josephson junction resonator frequency tuning process 100, one or more plasma treatments can be serially implemented to localized portions of the Josephson junction resonator die 104 so as to sequentially alter the target Josephson junctions 110.

As shown in FIG. 6, the one or more plasma treatments can be via an atmospheric plasma source 602 that can discharge the reactant plasma 502 by using a plasma source with a narrow beam that is directional or focused source, wherein the motion of the plasma gas beam can be further constricted with one or more apertures so that the reactant plasma 502 is a directed narrow beam of gas rather than a cloud. The advantage with a beam is that the mask 202 may not need to be in tight proximity with the Josephson junction resonator die 104 but may just be more of an aperture some distance above. The plasma beam source can be moved to be localized to the proximity of one or more particular mask holes 204. Thereby, the entirety of the mask holes 204 can be subjected to reactant plasma 502 via a series of plasma discharges, wherein each plasma discharge can be selectively employed to mask holes 204 sequentially (e.g., as opposed to in parallel, as shown in FIG. 5). In one or more embodiments, the plasma treatment characteristics (e.g., reactant composition, plasma frequency, exposure time, and/or the like) can vary between discharges. Thereby, the degree of electrical resistance transitioning can vary between target Josephson junctions 110 by altering the plasma treatment characteristics between serial plasma discharges.

For instance, a plasma treatment can include at least two plasma discharges directed to at least two target Josephson junctions 110. A first plasma discharge of the example plasma treatment can be directed to a first target Josephson junction 110 and can employ a first set of characteristics (e.g., reactant composition, plasma frequency, exposure time, and/or the like). Whereas a second plasma discharge of the example plasma treatment can be directed to a second Josephson junction 110 and can employ a second set of characteristics (e.g., reactant composition, plasma frequency, exposure time, and/or the like). Thus, the first target Josephson junction 110 and the second target Josephson junction 110 can experience differing amounts of electrical resistance alteration due at least in part to a difference between the two sets of plasma treatment characteristics.

In one or more embodiments, the one or masks 202 can be an inert gasket positioned over the one or more Josephson junction resonators 102 under compression so as to protect some Josephson junctions 110 while exposing target Josephson junctions 110. For example, the positioning of the one or more masks 202 can be limited to a portion of the Josephson junction resonator die 104 corresponding to the localized discharge proximity of the plasma treatment, wherein the one or more masks 202 can be repositioned as the plasma source serially repositions so as to remain within the localized discharge proximity. For instance, as the atmospheric plasma source 602 is relocated from the position of one exposed Josephson junction 110 to another, the one or more masks 202 (e.g., inert gasket) can likewise be relocated to facilitate the desired guidance of the discharged reactant plasma 502.

In various embodiments, the electrical resistance of the Josephson junction resonators 102 can be re-measured subsequent to the one or more plasma treatments. Wherein the transitioned electrical resistance (e.g., measured subsequent to one or more plasma treatments) remains different that the desired electrical resistance, the one or more plasma treatments can be repeated to achieve the desired electrical resistance.

Figure 7:
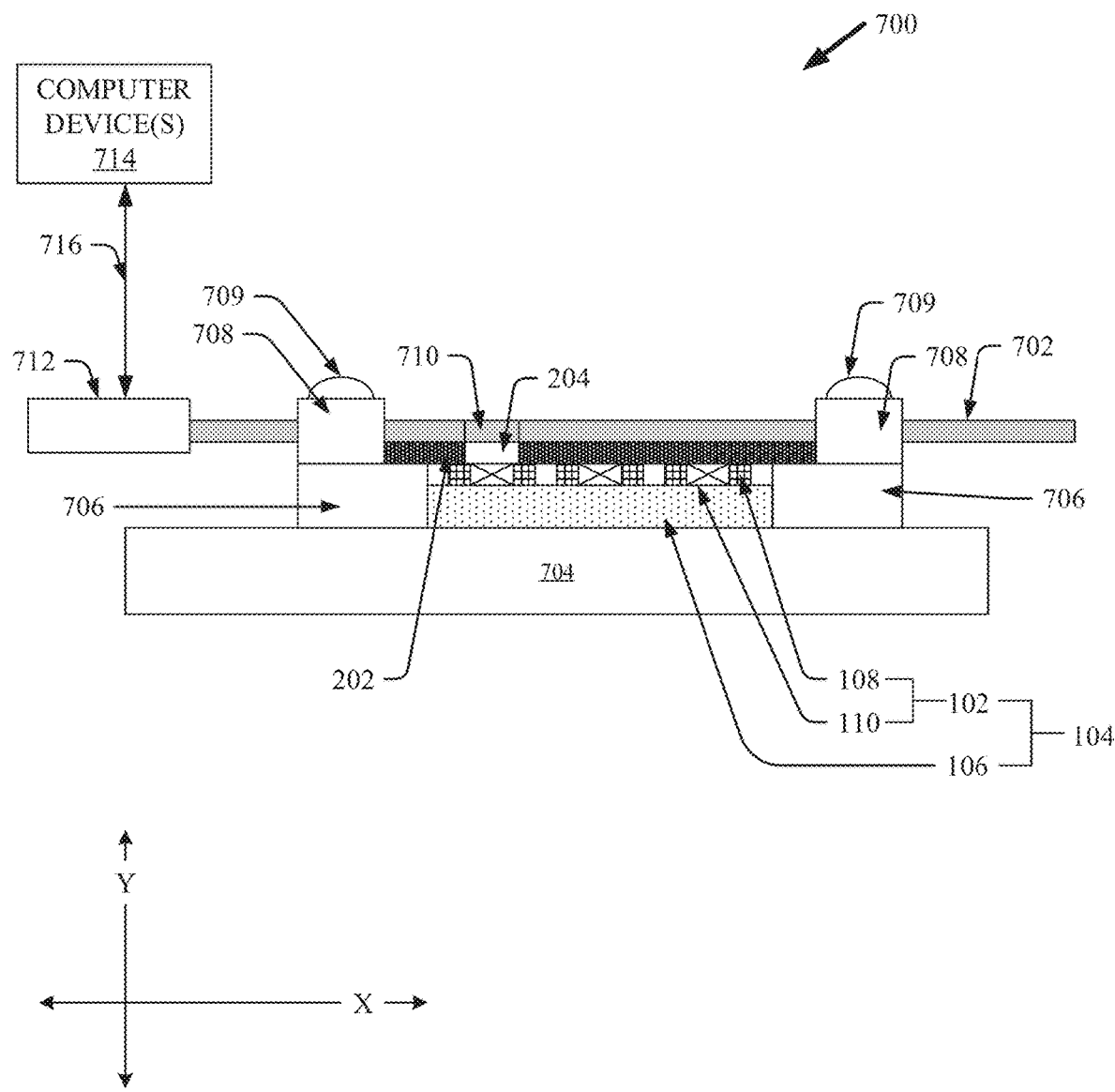
FIG. 7 illustrates a diagram of an example, non-limiting cross-sectional view of a cover sheet apparatus that can control an alignment of one or more cover sheets to facilitate one or more Josephson junction resonator frequency tuning processes in accordance with one or more embodiments described herein.

FIG. 7 illustrates a diagram of an example, non-limiting shielding device 700 that can facilitate the Josephson junction resonator frequency tuning process 100 in accordance with one or more embodiments described herein. Repetitive description of like elements employed in other embodiments described herein is omitted for sake of brevity. As shown in FIG. 7, the shielding device 700 can house the Josephson junction resonator die 104 during the Josephson junction resonator frequency tuning process 100. Additionally, the shielding device 700 can control one more cover sheets 702 that can further guide the discharge of plasma during the one or more plasma treatments.

In various embodiments, the shielding device 700 can comprise a support platform 704. As shown in FIG. 7, the one or more Josephson junction resonator dies 104 can be positioned on at least a portion of the support platform 704. The support platform 704 can thereby provide structural and/or mechanical support to the Josephson junction resonator die 104. Further, the support platform 704 can comprise one or more rigid materials. Example materials that can be comprised within the support platform 704 can include, but are not limited to: stainless steel, Al, steel, Cu, Mo, Ti, Ta, glass, quartz, Si, SiC, other metals a combination thereof, and/or the like. Additionally, the shielding device 700 can comprise a pocket 706 that can house the Josephson junction resonator die 104 as the Josephson junction resonator die 104 is located on the support platform 704. For example, the pocket 706 can surround, or substantially surround, the sides of the Josephson junction resonator die 104. In one or more embodiments the pocket 706 can restrict movement of the Josephson junction resonator die 104 on the support platform 704. In some examples, the pocket 706 can be formed integrally with the support platform 704. In other examples, the pocket 706 can be a distinct and/or adjustable feature (e.g., the position of the pocket 706 can be adjusted on the support platform 704 depending on the dimensions of the Josephson junction resonator die 104). Example materials that can be comprised within the pocket 706 can include, but are not limited to: stainless steel, Al, steel, Cu, Mo, Ti, Ta, glass, quartz, Si, SiC, other metals a combination thereof, and/or the like.

In one or more embodiments, the one or more masks 202 can be deposited and/or patterned onto the one or more Josephson junction resonators 102 prior to placement of the Josephson junction resonator die 104 onto the support platform 705. In various embodiments, the one or more masks 202 can be deposited and/or patterned onto the one or more Josephson junction resonators 102 subsequent to placement of the Josephson junction resonator die 104 onto the support platform 705. For example, the one or more masks 202 can extend onto the pocket 706 (e.g., as shown in FIG. 7). The one or more masks 202 can be deposited and/or patterned in accordance with the various embodiments described herein.

As shown in FIG. 7, one or more slide guides 708 can be further positioned on the pocket 706. For example, the one or more slide guides 708 can be secured to the pocket 706 via one or more fastening devices 709 (e.g., screws, bolts, nails, adhesives, and/or the like). In various embodiments, the one or more slide guides 708 can guide the movement of the one or more cover sheets 702. For example, the cover sheets 702 can move in a lateral direction with respect to the housed Josephson junction resonator die 104 (e.g., along the x-axis shown in FIG. 7). For instance, the lateral direction can be on a plane that is substantially parallel to a surface of the Josephson junction resonator die 104 comprising the one or more Josephson junction resonators 102. Further, the cover sheet 702 can comprise one or more cover sheet holes 710. As the cover sheet 702 moves along the lateral direction (e.g., along the x-axis shown in FIG. 7) the one or more cover sheet holes 710 can align or misalign with the one or more mask holes 204.

The movement of the cover sheet 702 can be controlled via one or more actuators 712 (e.g., linear or screw driven, rotary, piezoelectric, pneumatic, hydraulic, a combination thereof, and/or the like) operably coupled to the one or more cover sheets 702. Further, the one or more actuators 712 can be controlled by one or more computer devices 714. The one or more computer devices 714 can include one or more processors (e.g., central processing units ("CPUs"), microprocessors, and/or the like) that can execute program instructions to control operation of the one or more actuators 712 and thereby movement of the cover sheet 702. The one or more computer devices 714 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like.

In various embodiments, the one or more computer devices 714 can be operably coupled to the one or more actuators 712 via one or more networks 716. The one or more networks 716 can comprise wired and wireless networks, including, but not limited to, a cellular network, a wide area network (WAN) (e.g., the Internet) or a local area network (LAN). For example, the one or more computer devices 714 can communicate with the one or more actuators 712 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like.

The one or more plasma treatments described herein can discharge plasma onto the cover sheet 702. For example, the one or more plasma treatments can discharge the reactant plasma 502 onto a side of the cover sheet 702 facing away from the Josephson junction resonator die 104 (e.g., a top side of the cover sheet 702 along the y-axis depicted in FIG. 7). Subsequently, the reactant plasma 502 can be exposed to the one or more masks 202 via the one or more cover sheet holes 710. Wherein the one or more cover sheet holes 710 are aligned, or partially aligned, with the one or more mask holes 204 (e.g., as shown in FIG. 7), the reactant plasma 502 can be further exposed to the one or more target Josephson junctions 110. As the cover sheet 702 moves along the lateral direction (e.g., along the x-axis shown in FIG. 7), different portions of the one or more masks 202 (e.g., different mask holes 204) can be exposed or covered by the cover sheet 702.

In various embodiments, the shielding device 700 can enable target Josephson junctions 110 to be serially exposed to plasma treatment despite the plasma treatment not be localized to a particular region. For example, the one or more plasma treatments can discharge reactant plasma 502 onto the cover sheet 702, whereupon fluid communication of the reactant plasma 502 with the mask holes 204 can be established or unestablished by the positioning of the one or more cover sheet holes 710 controlled by the movement of the cover sheet 702.

Figure 8:
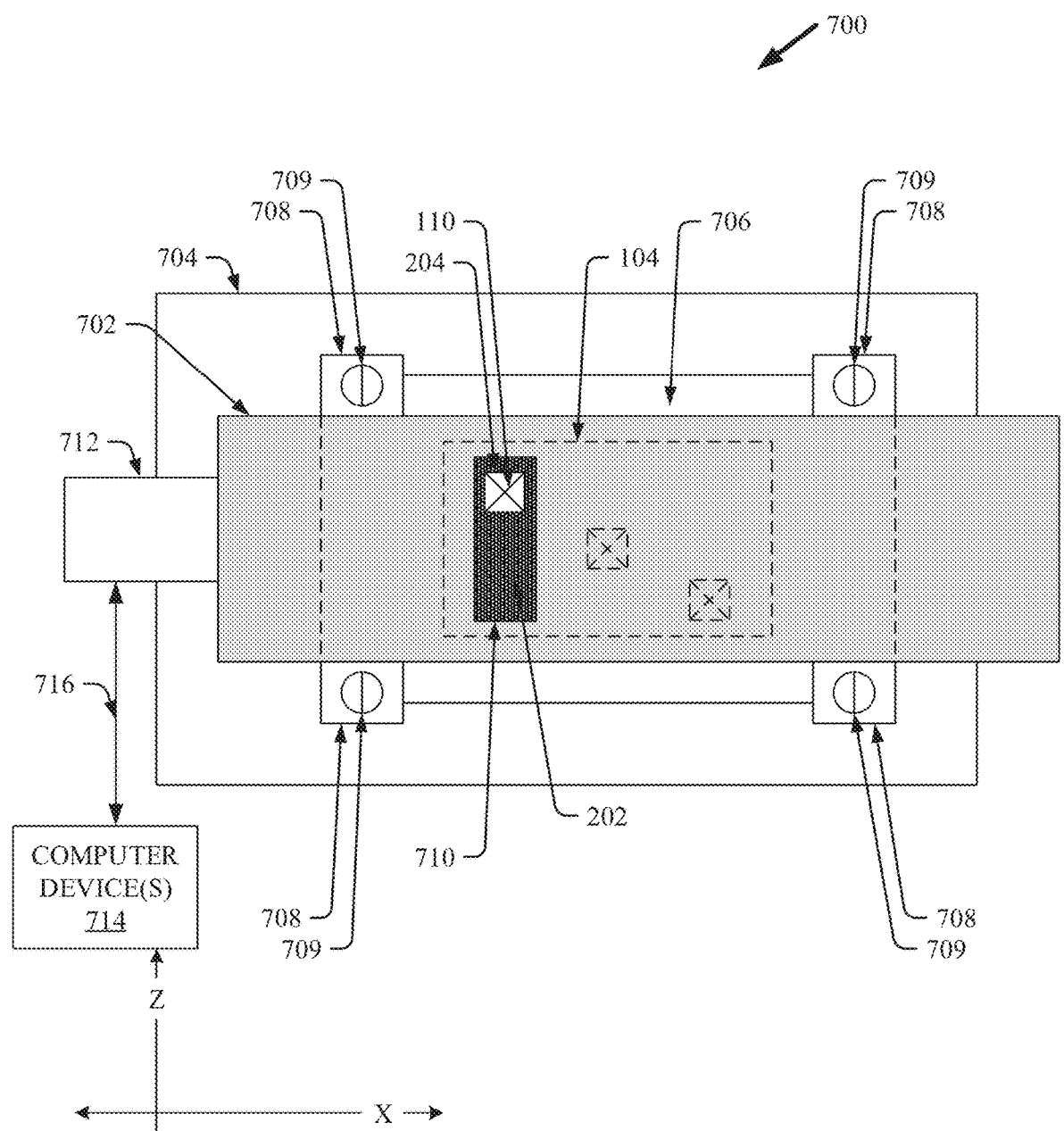
FIG. 8 illustrates a diagram of an example, non-limiting top-down view the cover sheet apparatus that can control an alignment of one or more cover sheets to facilitate one or more Josephson junction resonator frequency tuning processes in accordance with one or more embodiments described herein.

FIG. 8 illustrates a diagram of an example, non-limiting top-down view of the example shielding device 700 in accordance with one or more embodiments describe herein. Repetitive description of like elements employed in other embodiments described herein is omitted for sake of brevity. FIG. 8 depicts an example cover sheet hole 710 configuration in which the cover sheet 702 comprises a single cover sheet hole 710. As shown in FIG. 8, the cover sheet hole 710 can have dimensions exceeding the one or more mask holes 204. In various embodiments, the dimensions of the one or more cover sheet holes 710 can be large enough to encompass a plurality of mask holes 204 such that a cover sheet hole 710 can expose multiple mask holes 204 simultaneously from a single position. One of ordinary skill in the art will recognize that the size, arrangement, and/or number of cover sheet holes 710 can vary depending on the size, arrangement, and/or number of mask holes 204. As shown in FIG. 8, at least a portion of the one or more cover sheet holes 710 can be aligned, or partially aligned, with one or more mask holes 204 depending on the positioning of the cover sheet 702.

Figure 9:
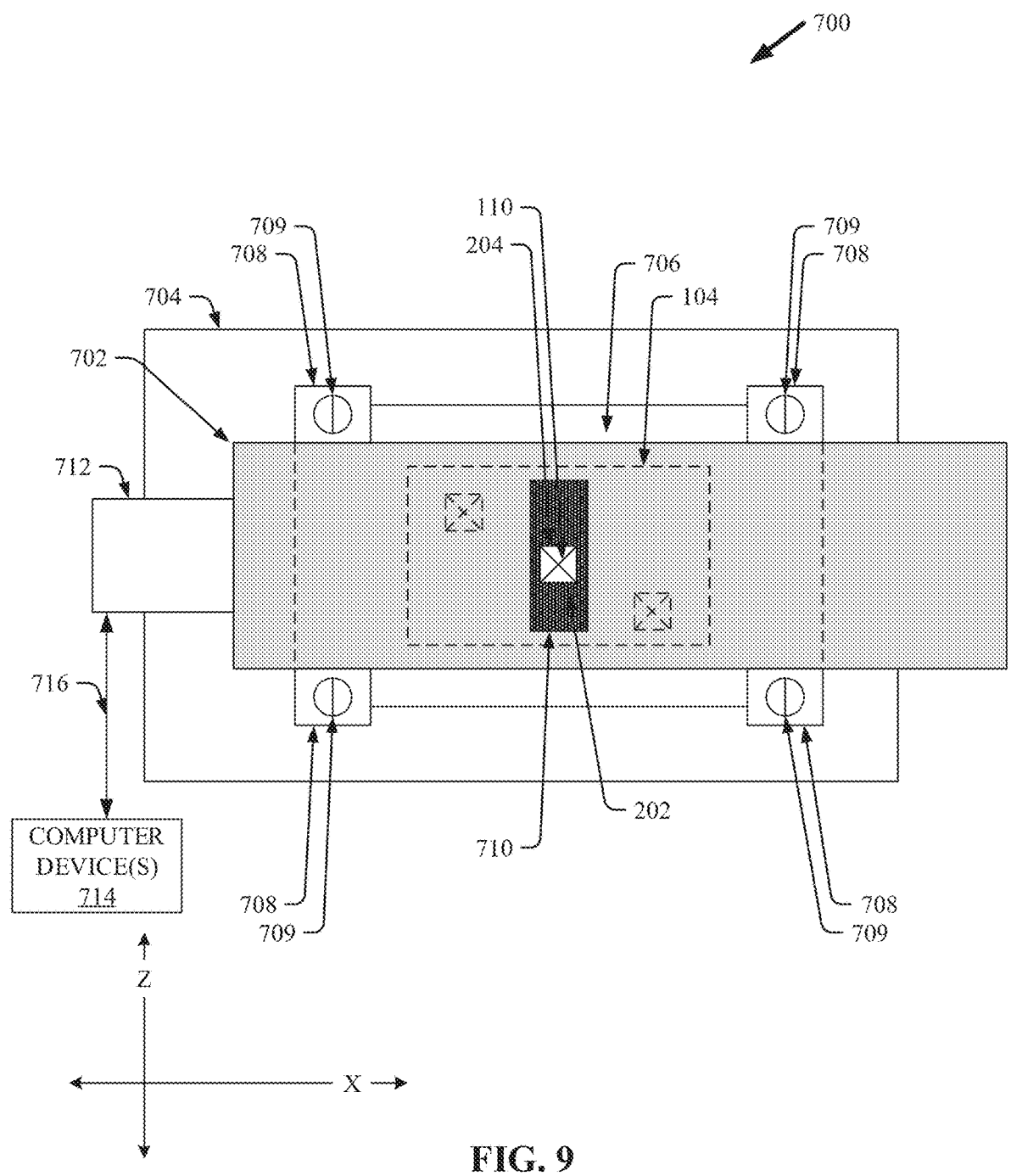
FIG. 9 illustrates a diagram of an example, non-limiting top-down view the cover sheet apparatus that can control an alignment of one or more cover sheets to facilitate one or more Josephson junction resonator frequency tuning processes in accordance with one or more embodiments described herein.

FIG. 9 illustrates a diagram of an example, non-limiting top-down view of the example shielding device 700 in accordance with one or more embodiments describe herein. Repetitive description of like elements employed in other embodiments described herein is omitted for sake of brevity. FIG. 9 depicts the cover sheet 702 at a second position as compared to a first position depicted in FIG. 8. The cover sheet 702 can move along the lateral direction (e.g., as controlled by the one or more actuators 712 and/or guided by the one or more slide guides 708) from a first position depicted in FIG. 8 to a second position depicted in FIG. 9.

For example, at the first cover sheet 702 position depicted in FIG. 8, the far left Josephson junction 110 can be targeted for alteration by the plasma treatment while the middle Josephson junction 110 and far right Josephson junction 110 can be shielded from the plasma treatment. At the second cover sheet 702 position depicted in FIG. 9, the middle Josephson junction 110 can be targeted for alteration by the plasma treatment while the far left and far right Josephson junctions 110 can be shielded from the plasma treatment. Thereby, a comparison of FIGS. 8 and 9 can exemplify how target Josephson junctions 110 (e.g., the far left and middle Josephson junctions 110) can be serially exposed to plasma treatment by movement of the cover sheet 702, while maintaining a shielding of one or more Josephson junctions 110 that are to remain unaltered by the plasma treatment (e.g., the far right Josephson junction 110).

As described herein, various embodiments can include a series of plasma treatments, wherein characteristics of the plasma treatments (e.g., reactant composition) can vary between plasma discharges of the series. Further, the positioning of the cover sheet 702 along the lateral direction (e.g., along the x-axis) can vary between plasma discharges of the series. Additionally, in one or more embodiments the position of the cover sheet 702 can be controlled so as to modulate the plasma exposure time experienced by select Josephson junctions 110; thereby modulating the amount of electrical resistance transitioning experienced by the select Josephson junctions 110. For example, the cover sheet 702 can remain at the first position depicted in FIG. 8 for a longer or shorter period of time than at the second position depicted in FIG. 9; thereby the amount of electrical resistance alteration experienced by the far left Josephson junction 110 and the middle Josephson junction 110 can be different even if other characteristics of the plasma treatment remain constant.

Figure 10:
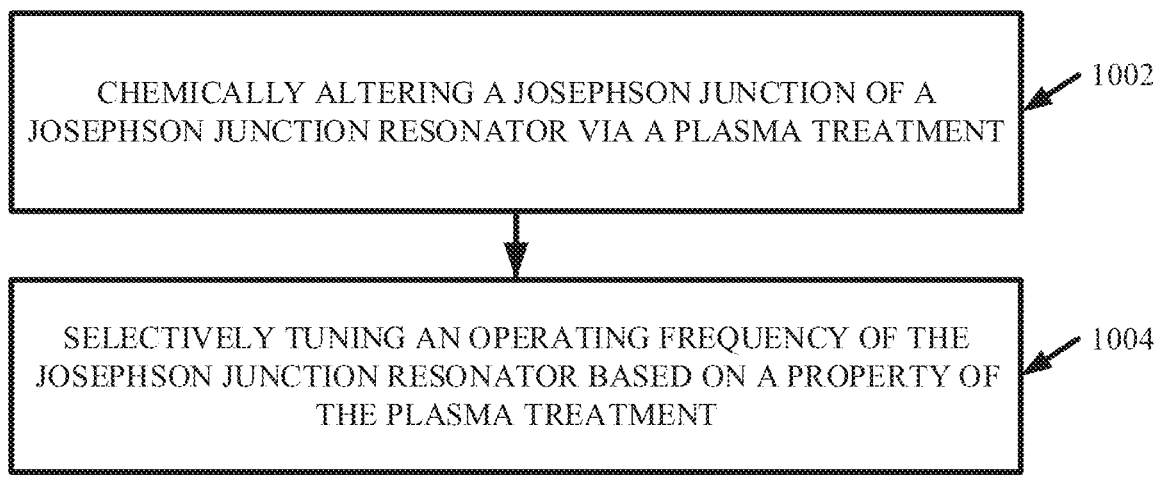
FIG. 10 illustrates a flow diagram of an example, non-limiting method that can modify the operating frequency of one or more selected Josephson junction resonators (e.g., superconducting qubits) in accordance with one or more embodiments described herein.

FIG. 10 illustrates a flow diagram of an example, non-limiting method 1000 that can facilitate the Josephson junction resonator frequency tuning process 100 in accordance with various embodiments described herein. Repetitive description of like elements employed in other embodiments described herein is omitted for sake of brevity.

At 1002, the method 1000 can comprise chemically altering one or more Josephson junctions 110 of one or more Josephson junction resonators 102 via one or more plasma treatments. For example, the electrical resistance of the one or more Josephson junctions 110 can be altered by exposure to one or more reactant plasmas 502 of the one or more plasma treatments. For instance, the one or more Josephson junction resonators 102 can be comprised within an array of Josephson junction resonators 102 (e.g., arranged on a semiconductor substrate 106 as a Josephson junction resonator die 104). Further, chemically altering the one or more Josephson junctions 110 can comprise targeting the one or more Josephson junctions based on measured electrical resistance, and/or directing the implementation of the one or more plasma treatments via one or more patterned masks 202.

At 1004, the method 1000 can comprise selectively tuning an operating frequency of the one or more Josephson junction resonators based on a property of the one or more plasma treatments. For example, the chemical alterations performed at 1002 can be influenced at 1004 by controlling one or more properties of the one or more plasma treatments. Example plasma treatment properties that can affect the chemical alterations can include, but are not limited to: a processing time of the plasma treatment, a chemical composition of the plasma treatment, an amount of energy delivered to the Josephson junction by the plasma treatment, partial pressures of the plasma gases, a combination thereof, and/or the like. By varying one or more of the plasma treatment properties, the amount of electrical resistance modification experienced by the one or more Josephson junctions 110 can also be varied; thereby tuning the operating frequency of select Josephson junctions 110.

In various embodiments, Josephson junctions 110 can be selectively tuned by modulating the amount of time the respective Josephson junctions 110 are exposed to the one or more plasma treatments. Wherein multiple Josephson junctions 110 are tuned, the plasma exposure time can vary between Josephson junctions 110; thereby varying the amount of electrical resistance transitioning. Additionally, in one or more embodiments the one or more plasma treatments can include a series of plasma discharges, wherein different Josephson junctions 110 can be targeted by respective discharges and/or different plasma treatment characteristics can be employed by respective discharges. For example, the one or more plasma treatments can implement localized discharges of the reactant plasma 502 and chemically alter a plurality of Josephson junctions 110 is series (e.g., one Josephson junction 110 at a time, or one group of Josephson junctions 110 at a time). In another example, a plurality of the Josephson junctions 110 targeted for chemical alteration (e.g., all the Josephson junctions 110 targeted for chemical alteration) can be exposed to the one or more plasma treatments in parallel (e.g., at once). In one or more embodiments, the one or more Josephson junctions 110 can be exposed to a hydrogen plasma discharge following by an oxygen plasma discharge.

Figure 11:
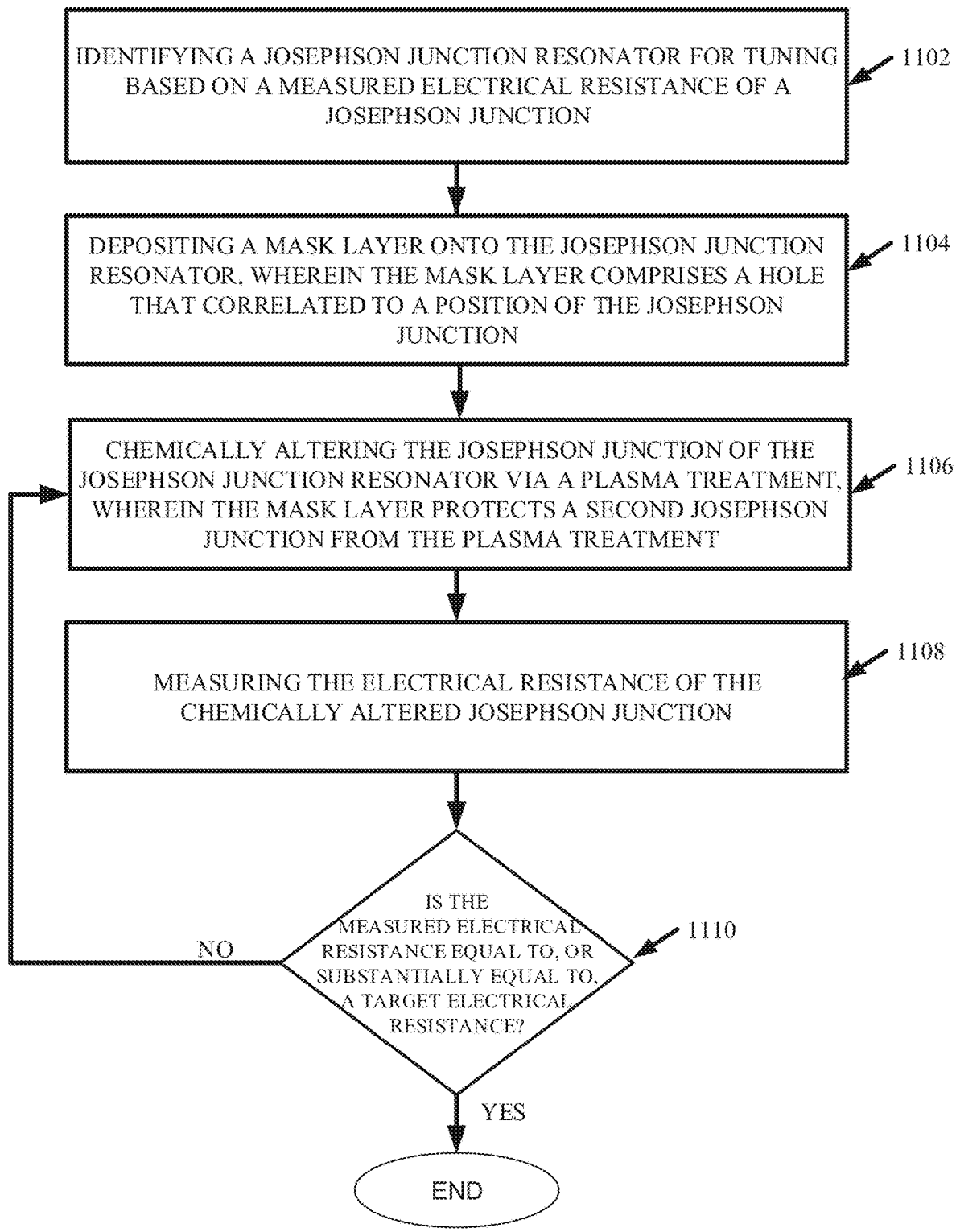
FIG. 11 illustrates a flow diagram of an example, non-limiting method that can modify the operating frequency of one or more selected Josephson junction resonator (e.g., superconducting qubits) in accordance with one or more embodiments described herein.

FIG. 11 illustrates a flow diagram of an example, non-limiting method 1100 that can facilitate the Josephson junction resonator frequency tuning process 100 in accordance with various embodiments described herein. Repetitive description of like elements employed in other embodiments described herein is omitted for sake of brevity.

At 1102, the method 1100 can comprise identifying one or more Josephson junction resonators 102 for tuning based on a measured electrical resistance of one or more Josephson junctions 110 of the one or more Josephson junction resonators 102. For example, identifying the one or more Josephson junction resonators 102 at 1102 can be performed in accordance with the first stage of the Josephson junction resonator frequency tuning process 100 and in accordance with various embodiments described herein. For instance, one or more Josephson junction resonators 102 can be identified for chemical alteration based on having a measured electrical resistance that deviates from a target electrical resistance by more than a defined threshold.

At 1104, the method 1100 can comprise depositing one or more mask layers (e.g., masks 202) onto the one or more Josephson junction resonators 102, wherein the mask layer can comprise one or more holes (e.g., mask holes 204) that can correlate to one or more positions of the one or more Josephson junctions 110. For example, depositing the one or more mask layers at 1104 can be performed in accordance with the second stage of the Josephson junction resonator frequency tuning process 100 and in accordance with various embodiments described herein. As described herein, the one or more mask layers (e.g., masks 202) can leave the identified Josephson junction resonators 102 at least partially exposed while shielding one or more neighboring Josephson junction resonators 102. Further, the one or more mask layers can include one or more patterned electrodes 302 (e.g., positioned adjacent to the one or more holes) and/or multiple layers (e.g., first layer 402 and/or second layer 404), as described herein.

At 1106, the method 1100 can comprise chemically altering the one or more Josephson junctions 110 of the one or more Josephson junction resonators 102 via one or more plasma treatments, wherein the one or more mask layers can protect one or more second Josephson junction resonators 102 from the one or more plasma treatments. For example, chemically altering the one or more Josephson junctions 110 at 1106 can be performed in accordance with the third stage of the Josephson junction resonator frequency tuning process 100 and in accordance with various embodiments described herein. For instance, the electrical resistance of the one or more Josephson junctions 110 can be altered by exposure to one or more reactant plasmas 502 of the one or more plasma treatments. For instance, the one or more Josephson junction resonators 102 can be comprised within an array of Josephson junction resonators 102 (e.g., arranged on a semiconductor substrate 106 as a Josephson junction resonator die 104). Further, the chemical alterations can be modifications to the electrical resistance of the one or more Josephson junctions 110 and can be influenced controlling one or more properties of the one or more plasma treatments. Example plasma treatment properties that can affect the chemical alterations can include, but are not limited to: a processing time of the plasma treatment, a chemical composition of the plasma treatment, an amount of energy delivered to the Josephson junction by the plasma treatment, a combination thereof, and/or the like. By varying one or more of the plasma treatment properties, the amount of electrical resistance modification experienced by the one or more Josephson junctions 110 can also be varied; thereby tuning the operating frequency of select Josephson junctions 110.

In various embodiments, Josephson junctions 110 can be selectively tuned by modulating the amount of time the respective Josephson junctions 110 are exposed to the one or more plasma treatments. Wherein multiple Josephson junctions 110 are tuned, the plasma exposure time can vary between Josephson junctions 110; thereby varying the amount of electrical resistance transitioning. Additionally, in one or more embodiments the one or more plasma treatments can include a series of plasma discharges, wherein different Josephson junctions 110 can be targeted by respective discharges and/or different plasma treatment characteristics can be employed by respective discharges. For example, the one or more plasma treatments can implement localized discharges of the reactant plasma 502 and chemically alter a plurality of Josephson junctions 110 is series (e.g., one Josephson junction 110 at a time, or one group of Josephson junctions 110 at a time). In another example, a plurality of the Josephson junctions 110 targeted for chemical alteration (e.g., all the Josephson junctions 110 targeted for chemical alteration) can be exposed to the one or more plasma treatments in parallel (e.g., at once). In one or more embodiments, the one or more Josephson junctions 110 can be exposed to a hydrogen plasma discharge following by an oxygen plasma discharge.

At 1108, the method 1100 can comprise measuring the electrical resistance of the chemically altered one or more Josephson junctions 110. For example, the measuring at 1108 can also be performed in accordance with the first stage of the Josephson junction resonator frequency tuning process 100 and in accordance with various embodiments described herein. At 1110, the method 1100 can proceed based on whether the measured electrical resistance is equal to, or substantially equal to, a target electrical resistance. For example, the method 1100 can comprise determining whether the electrical resistance achieved via the plasma treatment deviates from the target electrical resistance by more than the defined threshold employed to identify the one or more Josephson junction resonators 102 at 1102. Wherein the measured electrical resistance is substantially equal to the target electrical resistance (e.g., the electrical resistance deviation is less than the defined threshold) the measured Josephson junction resonator 102 can be considered tuned to the desired operating frequency and the method 1100 can end. Wherein the measured electrical resistance is not substantially equal to the target electrical resistance (e.g., the electrical resistance deviation is greater than the defined threshold) the method 1100 can repeat steps 1106-1110 until the target electrical resistance is met.

Figure 12:
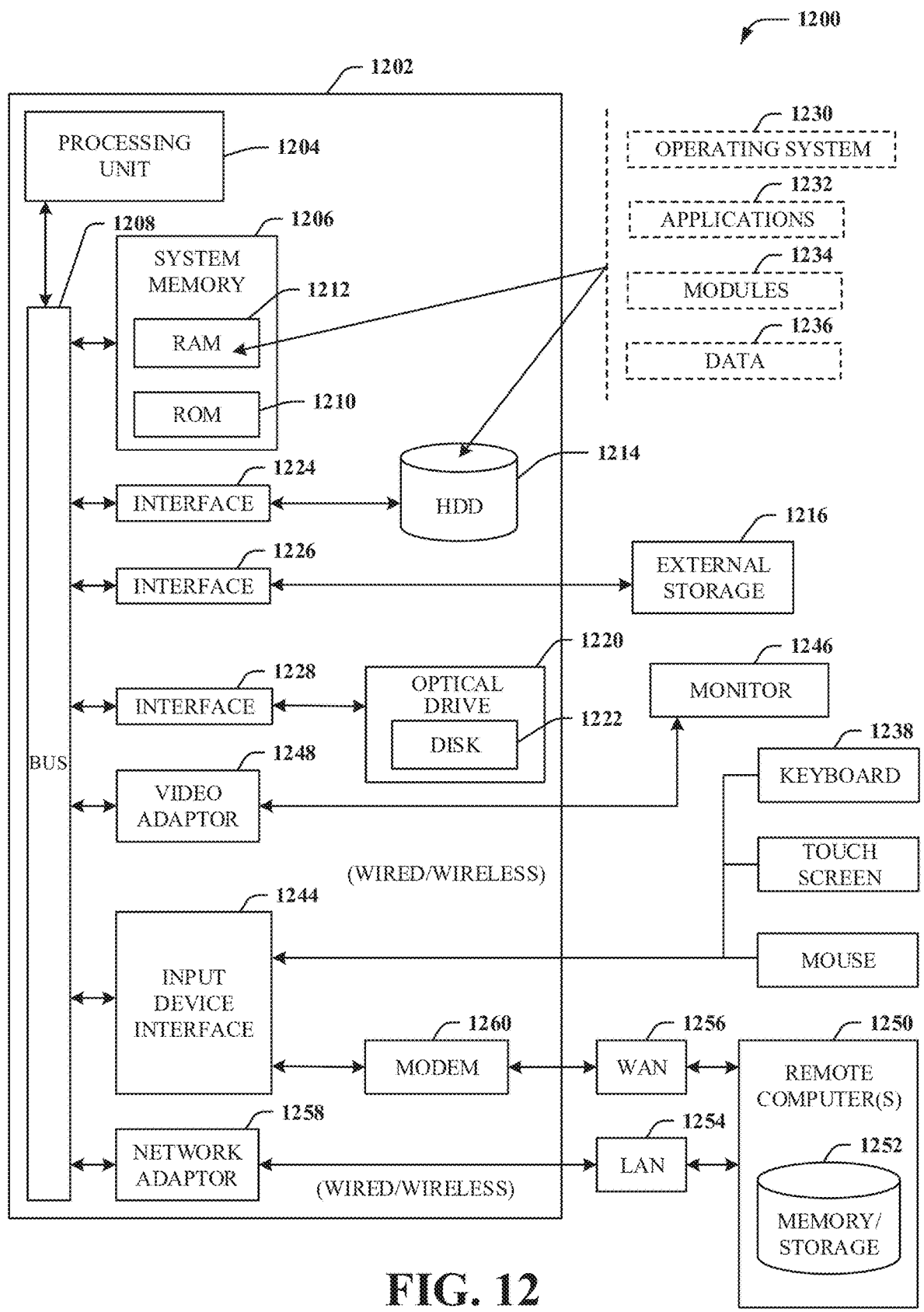
FIG. 12 illustrates a block diagram of an example, non-limiting operating environment in which one or more embodiments described herein can be facilitated.

In order to provide additional context for various embodiments described herein, FIG. 12 and the following discussion are intended to provide a general description of a suitable computing environment 1200 in which the various embodiments of the embodiment described herein can be implemented. For example, the one or more computer devices 714 described herein can employ computing environment 1200 to execute one or more program instructions that can control operation of the one or more actuators 712 and cover sheet 702. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things ("IoT") devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory ("RAM"), read only memory ("ROM"), electrically erasable programmable read only memory ("EEPROM"), flash memory or other memory technology, compact disk read only memory ("CD-ROM"), digital versatile disk ("DVD"), Blu-ray disc ("BD") or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 12, the example environment 1200 for implementing various embodiments of the aspects described herein includes a computer 1202, the computer 1202 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes ROM 1210 and RAM 1212. A basic input/output system ("BIOS") can be stored in a non-volatile memory such as ROM, erasable programmable read only memory ("EPROM"), EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive ("HDD") 1214 (e.g., EIDE, SATA), one or more external storage devices 1216 (e.g., a magnetic floppy disk drive ("FDD") 1216, a memory stick or flash drive reader, a memory card reader, etc.) and an optical disk drive 1220 (e.g., which can read or write from a CD-ROM disc, a DVD, a BD, etc.). While the internal HDD 1214 is illustrated as located within the computer 1202, the internal HDD 1214 can also be configured for external use in a suitable chassis (not shown). Additionally, while not shown in environment 1200, a solid state drive ("SSD") could be used in addition to, or in place of, an HDD 1214. The HDD 1214, external storage device(s) 1216 and optical disk drive 1220 can be connected to the system bus 1208 by an HDD interface 1224, an external storage interface 1226 and an optical drive interface 1228, respectively. The interface 1224 for external drive implementations can include at least one or both of Universal Serial Bus ("USB") and Institute of Electrical and Electronics Engineers ("IEEE") 1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. The systems and methods described herein can be implemented utilizing various commercially available operating systems or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12. In such an embodiment, operating system 1230 can comprise one virtual machine ("VM") of multiple VMs hosted at computer 1202. Furthermore, operating system 1230 can provide runtime environments, such as the Java runtime environment or the .NET framework, for applications 1232. Runtime environments are consistent execution environments that allow applications 1232 to run on any operating system that includes the runtime environment. Similarly, operating system 1230 can support containers, and applications 1232 can be in the form of containers, which are lightweight, standalone, executable packages of software that include, e.g., code, runtime, system tools, system libraries and settings for an application.

Further, computer 1202 can be enable with a security module, such as a trusted processing module ("TPM"). For instance with a TPM, boot components hash next in time boot components, and wait for a match of results to secured values, before loading a next boot component. This process can take place at any layer in the code execution stack of computer 1202, e.g., applied at the application execution level or at the operating system ("OS") kernel level, thereby enabling security at any level of code execution.

A user can enter commands and information into the computer 1202 through one or more wired/wireless input devices, e.g., a keyboard 1238, a touch screen 1240, and a pointing device, such as a mouse 1242. Other input devices (not shown) can include a microphone, an infrared ("IR") remote control, a radio frequency ("RF") remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1204 through an input device interface 1244 that can be coupled to the system bus 1208, but can be connected by other interfaces, such as a parallel port, an IEEE 1394 serial port, a game port, a USB port, an IR interface, a BLUETOOTH® interface, etc.

A monitor 1246 or other type of display device can be also connected to the system bus 1208 via an interface, such as a video adapter 1248. In addition to the monitor 1246, a computer typically includes other peripheral output devices (not shown), such as speakers, printers, etc.

The computer 1202 can operate in a networked environment using logical connections via wired and/or wireless communications to one or more remote computers, such as a remote computer(s) 1250. The remote computer(s) 1250 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1252 is illustrated. The logical connections depicted include wired/wireless connectivity to a local area network ("LAN") 1254 and/or larger networks, e.g., a wide area network ("WAN") 1256. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 can be connected to the local network 1254 through a wired and/or wireless communication network interface or adapter 1258. The adapter 1258 can facilitate wired or wireless communication to the LAN 1254, which can also include a wireless access point ("AP") disposed thereon for communicating with the adapter 1258 in a wireless mode.

When used in a WAN networking environment, the computer 1202 can include a modem 1260 or can be connected to a communications server on the WAN 1256 via other means for establishing communications over the WAN 1256, such as by way of the Internet. The modem 1260, which can be internal or external and a wired or wireless device, can be connected to the system bus 1208 via the input device interface 1244. In a networked environment, program modules depicted relative to the computer 1202 or portions thereof, can be stored in the remote memory/storage device 1252. It will be appreciated that the network connections shown are example and other means of establishing a communications link between the computers can be used.

When used in either a LAN or WAN networking environment, the computer 1202 can access cloud storage systems or other network-based storage systems in addition to, or in place of, external storage devices 1216 as described above. Generally, a connection between the computer 1202 and a cloud storage system can be established over a LAN 1254 or WAN 1256 e.g., by the adapter 1258 or modem 1260, respectively. Upon connecting the computer 1202 to an associated cloud storage system, the external storage interface 1226 can, with the aid of the adapter 1258 and/or modem 1260, manage storage provided by the cloud storage system as it would other types of external storage. For instance, the external storage interface 1226 can be configured to provide access to cloud storage sources as if those sources were physically connected to the computer 1202.

The computer 1202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity ("Wi-Fi") and BLUETOOTH® wireless technologies. Thus, the communication can be a predefined structure as with a conventional network or simply an ad hoc communication between at least two devices.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    selecting a target Josephson junction resonator of a plurality of Josephson junction resonators on a substrate;
    chemically altering a Josephson junction of the target Josephson junction resonator via a plasma treatment, without chemically altering a second Josephson junction of the plurality of Josephson junction resonators via the plasma treatment; and
    selectively tuning an operating frequency of the target Josephson junction resonator based on a property of the plasma treatment.

2. The method of claim 1, wherein the property is at least one member selected from the group consisting of a processing time of the plasma treatment, a chemical composition of the plasma treatment, an amount of energy delivered to the Josephson junction by the plasma treatment, and a partial pressure of a gas employed by the plasma treatment.

3. The method of claim 2, wherein the plasma treatment exposes the Josephson junction to a series of plasmas, and wherein the plasma treatment alters an electrical resistance of the Josephson junction.

4. The method of claim 1, further comprising:
    localizing the plasma treatment to a proximity of the Josephson junction via a plasma beam.

5. The method of claim 1, further comprising:
    depositing a mask layer onto the plurality of Josephson junction resonators, wherein the mask layer comprises a hole that correlates to a position of the Josephson junction, and wherein the mask layer protects the second Josephson junction from the plasma treatment.

6. The method of claim 5, wherein the mask layer comprises a first surface facing the Josephson junction and a second surface facing the plasma treatment, wherein the first surface is characterized by a chemical composition that absorbs a plasma species of the plasma treatment, and wherein the second surface is characterized by another chemical composition that is inert to the plasma treatment.

7. The method of claim 5, further comprising:
    patterning an electrode at a perimeter of the hole in the mask layer, and controlling migration of a reactive species of the plasma treatment across the mask layer via operation of the electrode.

8. The method of claim 1, further comprising:
compressing an inert gasket onto the plurality of Josephson junction resonators, wherein the inert gasket comprises a hole that correlates to a position of the Josephson junction, and wherein the inert gasket seals the second Josephson junction neighboring the Josephson junction from the plasma treatment.

9. A method, comprising:
depositing a mask layer onto a Josephson junction resonator, wherein the mask layer comprises a hole that correlates to a position of a Josephson junction of the Josephson junction resonator;
altering the Josephson junction of the Josephson junction resonator via a plasma treatment; and
selectively tuning an operating frequency of the Josephson junction based on a property of the plasma treatment, wherein the mask layer protects a second Josephson junction from the plasma treatment.

10. The method of claim 9, wherein the plasma treatment exposes the Josephson junction to a series of plasmas, wherein the plasma treatment alters the electrical resistance of the Josephson junction, and wherein the property is at least one member selected from the group consisting of a processing time of the plasma treatment, a chemical composition of the plasma treatment, an amount of energy delivered to the Josephson junction by the plasma treatment, and a partial pressure of a gas employed by the plasma treatment.

11. The method of claim 9, further comprising:
localizing the plasma treatment to a proximity of the Josephson junction via a plasma beam.

12. The method of claim 9, further comprising:
depositing a mask layer onto the Josephson junction resonator, wherein the mask layer comprises a hole that correlates to a position of the Josephson junction, and wherein the mask layer protects a portion of the Josephson junction resonator from the plasma treatment.

13. The method of claim 12, wherein the mask layer comprises a first surface facing the Josephson junction resonator and a second surface facing the plasma treatment, wherein the first surface is characterized by a chemical composition that absorbs a plasma species of the plasma treatment, and wherein the second surface is characterized by another chemical composition that is inert to the plasma treatment.

14. The method of claim 9, further comprising:
compressing an inert gasket onto the Josephson junction resonator, wherein the inert gasket comprises a hole that correlates to a position of the Josephson junction, and wherein the inert gasket seals the second Josephson junction neighboring the Josephson junction from the plasma treatment.

15. A method, comprising:
exposing a Josephson junction of a Josephson junction resonator to a plasma treatment, wherein the plasma treatment tunes an operating frequency of the Josephson junction resonator to a target operating frequency by altering an electrical resistance of the Josephson junction; and
shielding a second Josephson junction from the plasma treatment, wherein the second Josephson junction neighbors the Josephson junction of the Josephson junction resonator.

16. The method of claim 15, wherein the plasma treatment exposes the Josephson junction to a series of plasmas.

17. The method of claim 15, further comprising:
localizing the plasma treatment to a proximity of the Josephson junction via a plasma beam.

* * * * *